(12) United States Patent
Narita et al.

(10) Patent No.: US 7,516,878 B2
(45) Date of Patent: Apr. 14, 2009

(54) BUMP FORMATION METHOD AND BUMP FORMING APPARATUS FOR SEMICONDUCTOR WAFER

(75) Inventors: Shoriki Narita, Hirakata (JP); Masahiko Ikeya, Sakai (JP); Yasutaka Tsuboi, Hirakata (JP); Takaharu Mae, Hirakata (JP); Shinji Kanayama, Kashihara (JP)

(73) Assignee: Panasonic Corporation, Osaka (JP)

( * ) Notice: Subject to any disclaimer, the term of this patent is extended or adjusted under 35 U.S.C. 154(b) by 576 days.

(21) Appl. No.: 11/317,146

(22) Filed: Dec. 27, 2005

(65) Prior Publication Data

US 2006/0102701 A1      May 18, 2006

Related U.S. Application Data

(62) Division of application No. 10/415,587, filed as application No. PCT/JP01/10000 on Nov. 16, 2001, now Pat. No. 7,052,984.

(30) Foreign Application Priority Data

Nov. 21, 2000     (JP) ............................... 2000-354448

(51) Int. Cl.
    B23K 37/00      (2006.01)
    B23K 37/04      (2006.01)

(52) U.S. Cl. ........................... 228/9; 228/49.5; 228/103

(58) Field of Classification Search ....................... None
    See application file for complete search history.

(56) References Cited

U.S. PATENT DOCUMENTS

| | | |
|---|---|---|
| 4,688,939 A | 8/1987 | Ray |
| 5,119,168 A | 6/1992 | Misawa |
| 5,294,038 A | 3/1994 | Nakano |
| 5,492,863 A | 2/1996 | Higgins, III |

(Continued)

FOREIGN PATENT DOCUMENTS

JP      04-037034      2/1992

(Continued)

OTHER PUBLICATIONS

U.S. Appl. No. 09/988,704, filed Nov. 20, 2001, entitled "*Method and Apparatus for Correcting Inclination of IC on Semiconductor Wafer*".

(Continued)

*Primary Examiner*—Kiley Stoner
(74) *Attorney, Agent, or Firm*—Wenderoth, Lind & Ponack, L.L.P.

(57) ABSTRACT

A bump formation method and a bump forming apparatus for a semiconductor wafer are provided in which productivity when bumps are formed onto the semiconductor wafer is improved as compared with the conventional art. There are provided a bump forming head, a recognition device, and a control device. ICs formed on the semiconductor wafer are divided into basic blocks. Bump formation is performed continuously for the ICs included in one basic block. Positional recognition for the other basic blocks is performed only when the bump formation operation is shifted from one basic block to another basic block. Thus, in comparison with the conventional art whereby a positional recognition operation is performed every time bumps are formed on each IC, the number of times of performing positional recognition is greatly reduced, so that productivity can be improved.

6 Claims, 18 Drawing Sheets

U.S. PATENT DOCUMENTS

| | | |
|---|---|---|
| 5,648,729 A | 7/1997 | Yamauchi et al. |
| 5,694,482 A | 12/1997 | Maali et al. |
| 6,017,812 A | 1/2000 | Yonezawa et al. |
| 6,070,783 A | 6/2000 | Nakazato |
| 6,133,052 A * | 10/2000 | Ichihara ............ 438/7 |
| 6,193,132 B1 * | 2/2001 | Shibata et al. ............ 228/103 |
| 6,219,912 B1 | 4/2001 | Shimizu et al. |
| 6,225,205 B1 | 5/2001 | Kinoshita |
| 6,276,590 B1 * | 8/2001 | Nakazato ............ 228/41 |
| 6,284,568 B1 | 9/2001 | Yamamoto |
| 6,302,317 B1 | 10/2001 | Narita et al. |
| 6,324,068 B1 | 11/2001 | Shimizu et al. |
| 6,640,423 B1 | 11/2003 | Johnson et al. |
| 6,910,613 B2 * | 6/2005 | Narita et al. ............ 228/9 |
| 7,179,666 B2 * | 2/2007 | Kimura et al. ............ 438/15 |
| 2001/0042772 A1 * | 11/2001 | Narita et al. ............ 228/41 |
| 2002/0061129 A1 | 5/2002 | Narita et al. |
| 2005/0191838 A1 * | 9/2005 | Narita et al. ............ 438/613 |

FOREIGN PATENT DOCUMENTS

| | | |
|---|---|---|
| JP | 06201324 A * | 7/1994 |
| JP | 11-312703 | 11/1999 |
| JP | 2001-15536 | 1/2001 |

OTHER PUBLICATIONS

Database WPI, Section E1, Week 200102, Derwent Publications Ltd., London, GB; An 2000-335300 XP002215053 & KR 2000 012 116 A (Toshiba KK), Feb. 25, 2000.

* cited by examiner

BUMP FORMATION METHOD AND BUMP FORMING APPARATUS FOR SEMICONDUCTOR WAFER

This application is a divisional of U.S. application Ser. No. 10/415,587, filed Apr. 30, 2003, now U.S. Pat No. 7,052,984 which is a National Stage application of International Application No. PCT/JP01/10000, filed Nov. 16, 2001.

TECHNICAL FIELD

The present invention relates to a bump formation method for forming bumps on electrodes of each of ICs formed on a semiconductor wafer, and a bump forming apparatus which carries out the bump formation method.

BACKGROUND ART

Conventionally in forming bumps on electrodes of ICs (integrated circuits), bumps have been formed on every one of IC chips, i.e., an individual piece cut one by one from a semiconductor wafer. A conventional bump formation method is inferior in productivity because it requires a transfer time for each individual piece to be transferred to a bump bonding apparatus to form bumps. For shortening the transfer time, an arrangement of transferring a semiconductor wafer to the bump bonding apparatus to form bumps on the ICs on the semiconductor wafer has come to be performed.

When bumps are to be formed on ICs on the semiconductor wafer, it is necessary to recognize positions of the ICs to form bumps on electrodes of the ICs. The semiconductor wafer itself is heated to approximately 150-200° C. when bumps are formed, and this heating affects the bump bonding apparatus as well, e.g., thermally expands the apparatus or the like. As such, a mark for position recognition formed on each IC has been conventionally imaged by a recognition camera for every IC before the bumps are formed on each IC, thereby correcting a position of the semiconductor wafer.

The semiconductor wafer has, for example, nearly 3000-10000 ICs formed thereon. The larger the number of ICs, the more time it takes for positional recognition to form bumps. When for instance, 2-4 bumps are formed on each IC, forming one bump takes approximately 60-80 msec. On the other hand, recognizing one position recognition mark requires approximately 200-250 msec. Since two position recognition marks should be recognized for every IC, the time required for positional recognition is considerably long as compared with the time for forming bumps, thereby deteriorating productivity.

SUMMARY OF INVENTION

The present invention is devised to solve the above-described disadvantage and has for its object to provide a bump formation method and a bump forming apparatus for a semiconductor wafer in which productivity, when bumps are formed on the semiconductor wafer, is improved in comparison with the conventional art.

In accomplishing this and other objectives, according to a first aspect of the present invention there is provided a method for forming bumps on semiconductor wafers, comprising:

defining basic blocks, each of which has a plurality of ICs adjacent each other in a row or column direction or in row and column directions, from among ICs arranged in a grid pattern on the semiconductor wafer to be subjected to bump bonding; and performing positional recognition for forming bumps with respect to each of the basic blocks.

This bump formation method may be designed so that the method further comprises:

after performing the positional recognition, forming bumps for every one of the above-defined basic blocks continuously on ICs included in each basic block on a basis of the positional recognition; and when a bump formation operation is shifted from one basic block to another basic block from among a plurality of basic blocks, performing positional recognition for the another basic block for forming bumps on ICs included in the another basic block.

A number of ICs for defining a basic block can be set to a value so that positional deviations of all electrodes of all ICs in the basic block, and all bumps formed on the electrodes, are accommodated within an allowable range when the bumps are continuously formed on the electrodes.

The number of the ICs for defining the basic block may be determined further based on at least either a position on the semiconductor wafer where bumps are to be formed, or a time passed after a start of bump formation for the semiconductor wafer.

After a plurality of the basic blocks are defined, when remaining ICs of a number not satisfying the number of ICs for defining one of the basic blocks exist, bump formation and positional recognition for the remaining ICs may be performed for each of the remaining ICs or for a combination of a plurality of remaining ICs and one remaining IC until bumps are formed on all of the remaining ICs.

The positional recognition for the basic block can be performed by recognizing two marks for positional recognition present at diagonal positions of the basic block from among marks for positional recognition applied to each of ICs at both ends of the basic block.

An inclination of the ICs arranged on the semiconductor wafer is detected before the positional recognition operation is performed for the basic block, so that detecting inclination of ICs included in the basic block can be eliminated by recognizing only one of the two marks for positional recognition at a positional recognition time for the basic block.

Defective IC information showing a defective IC from among the ICs included in the basic block can be detected when bumps are continuously formed on the ICs.

It is possible not to form bumps on defective ICs on the basis of the defective IC information.

According to a second aspect of the present invention, an apparatus for forming bumps on a semiconductor wafer is provided, which comprises:

a bump bonding apparatus for forming the bumps on ICs arranged in a grid pattern on the semiconductor wafer to be subjected to bump bonding;

a recognition device including an image pickup camera movable in column and row directions above the semiconductor wafer for imaging marks for detection on the semiconductor wafer, and which detects a position and an inclination of the ICs on the basis of image pickup information of the image pickup camera; and a control device for defining basic blocks, each of which has a plurality of ICs adjacent each other in a row or column direction or in row and column directions, from among ICs arranged in a grid pattern on the semiconductor wafer, for controlling the recognition device so as to recognize positions in units of basic blocks, and for controlling the bump bonding apparatus on the basis of positional recognition information obtained by this positional recognition so as to continuously form bumps for every basic block on the ICs included in the basic block.

The control device can be adapted to obtain the number of ICs for defining one basic block on the basis of an allowance value for positional deviation between electrodes of the ICs and bumps to be formed on the electrodes.

The control device is further adaptable to determine the number of ICs for defining the basic block on the basis of at least either a position on the semiconductor wafer where bumps are to be formed, or a time passed after a start of bump formation for the semiconductor wafer.

After a plurality of the basic blocks are formed along the row or column direction, when remaining ICs of a number not satisfying the number of ICs for defining one of the basic blocks exist, the control device may cause bump formation and positional recognition for the remaining ICs to be performed for each of the remaining ICs or for a combination of a plurality of remaining ICs and one remaining IC until bumps are formed on all of the remaining ICs.

The control device may cause the positional recognition for the basic block to be performed by controlling the recognition device so as to recognize two marks for positional recognition from among marks for positional recognition applied to each IC of the basic block.

The bump forming apparatus may be provided with:

a wafer turning member onto which a semiconductor wafer to be subjected to bump bonding is loaded, and which is turned in a circumferential direction of this loaded semiconductor wafer; and a turning device for turning the wafer turning member in the circumferential direction via control of the control device, wherein the control device detects an inclination of ICs arranged on the semiconductor wafer, before a recognition operation for the basic block is performed, by controlling the recognition device, further corrects the inclination by controlling the turning device on the basis of a detected inclination value of the ICs so as to turn the semiconductor wafer loaded on the wafer turning member, and also controls the recognition device at a position recognition time for the basic block so as to recognize only one of the two marks for positional recognition and eliminate detection of inclination of the ICs included in the basic block.

The control device can control the recognition device to detect defective IC information showing a defective IC from among the ICs arranged on the semiconductor wafer.

The control device may control operation of the bump bonding apparatus on the basis of the defective IC information so as not to form bumps on defective ICs.

According to the bump formation method of the first aspect and the bump forming apparatus of the second aspect of the present invention as described above, there are provided the bump bonding apparatus, the recognition device, and the control device, and the ICs formed on the semiconductor wafer are divided into basic blocks. Bump formation is continuously performed for the ICs included in the basic blocks. Positional recognition for the basic blocks is conducted when bump formation is changed from one basic block to another basic block. As compared with the conventional art wherein a positional recognition operation is performed every time bumps are formed on each IC, the number of times of performing positional recognition is greatly reduced and productivity can be improved.

A position between an electrode and a bump can always be kept proper by determining the number of ICs for defining a basic block in accordance with at least one of a position on the semiconductor wafer where bump formation is to be performed and a time passed after start of bump formation.

Unless all ICs on the semiconductor wafer can be divided into blocks by using only the basic block, bump formation is performed for each IC of remaining ICs or for each combination of a plurality of ICs and one IC. Bumps can be formed on all ICs while the number of times of performing positional recognition is reduced, thereby improving productivity in comparison with the conventional art.

Since a distance between two marks for positional recognition is increased by so arranging as to recognize the position recognition marks at diagonal positions of the basic block, inclination of the basic block can be obtained with a higher accuracy.

Moreover, if inclination of ICs is detected in advance before bump formation, it is enough at a bump formation time to recognize one of two marks for positional recognition of the basic block. The number of times of performing the positional recognition can be further reduced, so that productivity can be further improved.

In addition, detecting a bad mark at the bump formation time prevents bump formation from being performed for ICs with bad marks. Therefore, a time to be spent for forming bumps on the ICs which is unnecessary can be reduced and productivity can be further improved.

BRIEF DESCRIPTION OF DRAWINGS

These and other aspects and features of the present invention will become clear from the following description taken in conjunction with preferred embodiments thereof with reference to the accompanying drawings, in which.

DETAILED DESCRIPTION OF THE PREFERRED EMBODIMENTS

Figure 1:
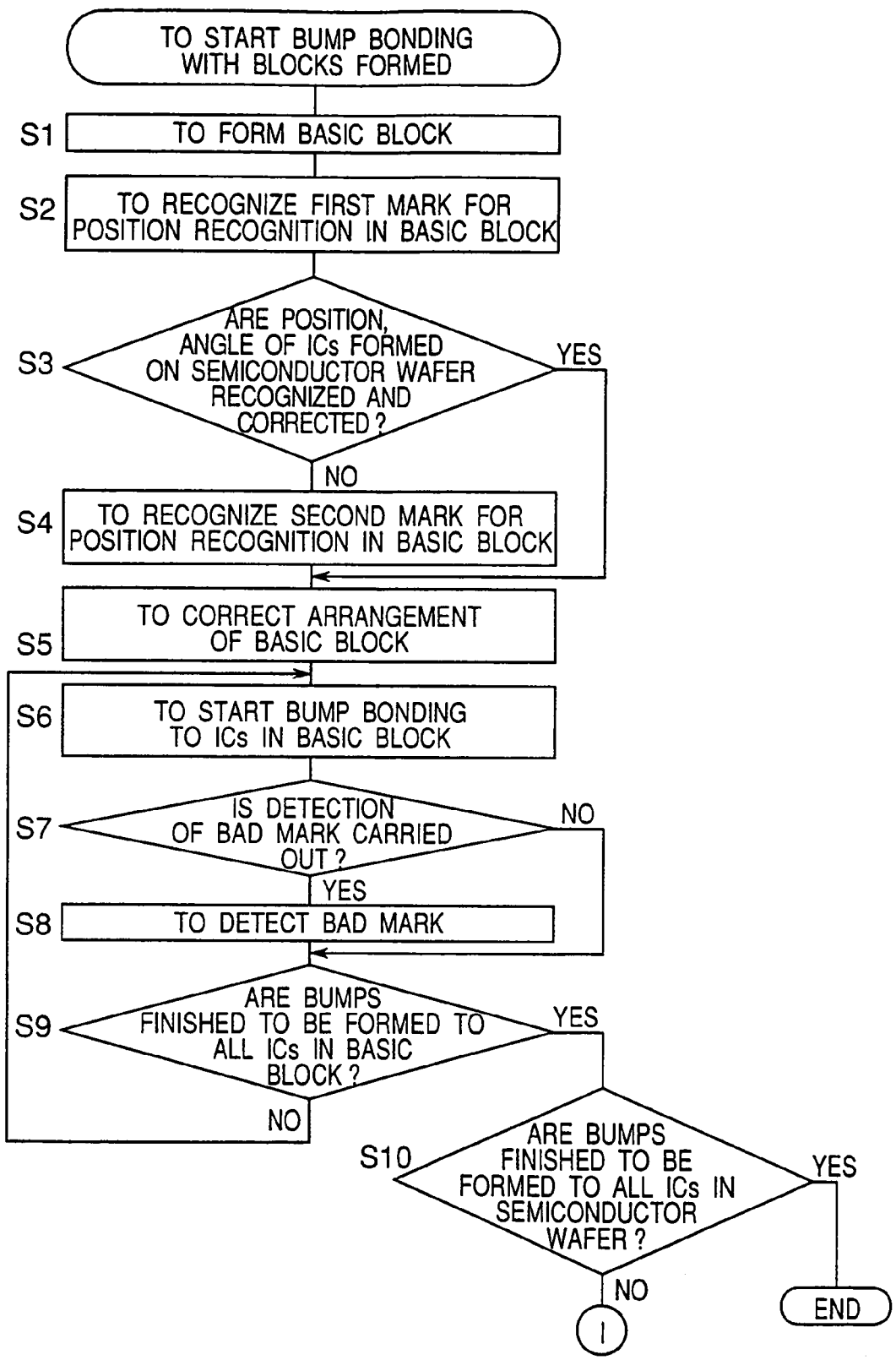
FIG. 1 is a flow chart showing operations of a bump formation method in a preferred embodiment of the present invention.

A bump formation method for a semiconductor wafer, and a bump forming apparatus for a semiconductor wafer which performs the bump formation method according to a preferred embodiment of the present invention will be described hereinbelow with reference to the drawings in which like parts are designated by like reference numerals. All of ICs (integrated circuits) formed on the semiconductor wafer are equal in size and in shape. A manner of forming ICs on the semiconductor wafer is not specified, such that ICs can be formed on an entire face including a circumferential edge part of the semiconductor wafer or ICs can be refrained from being formed on a marginal part when the marginal part is provided at a circumferential edge part.

In order to accomplish the above-described objective of improving productivity in forming bumps on a semiconductor wafer as compared with the conventional art, roughly, a first to a third operation as expressed below are intended to be performed during a bump formation method for the semiconductor wafer of the embodiment.

First, one block is defined by a plurality of ICs (integrated circuits) formed on the semiconductor wafer. Positional recognition is performed for every block by recognizing two marks for positional recognition included in each block, and positional recognition is omitted when bumps are formed on each of ICs included in the block. The number of times of performing positional recognition is thus reduced in comparison with the conventional art, so that productivity is improved.

Second, recognition of two marks for positional recognition in the block is reduced to one mark, thereby improving productivity more.

Third, presence/absence of bad marks applied to ICs on the semiconductor wafer, i.e. the ICs not functioning as ICs (defective ICs) is determined, so that bumps are not formed on these defective ICs. Thus, productivity is further improved.

Figure 29:
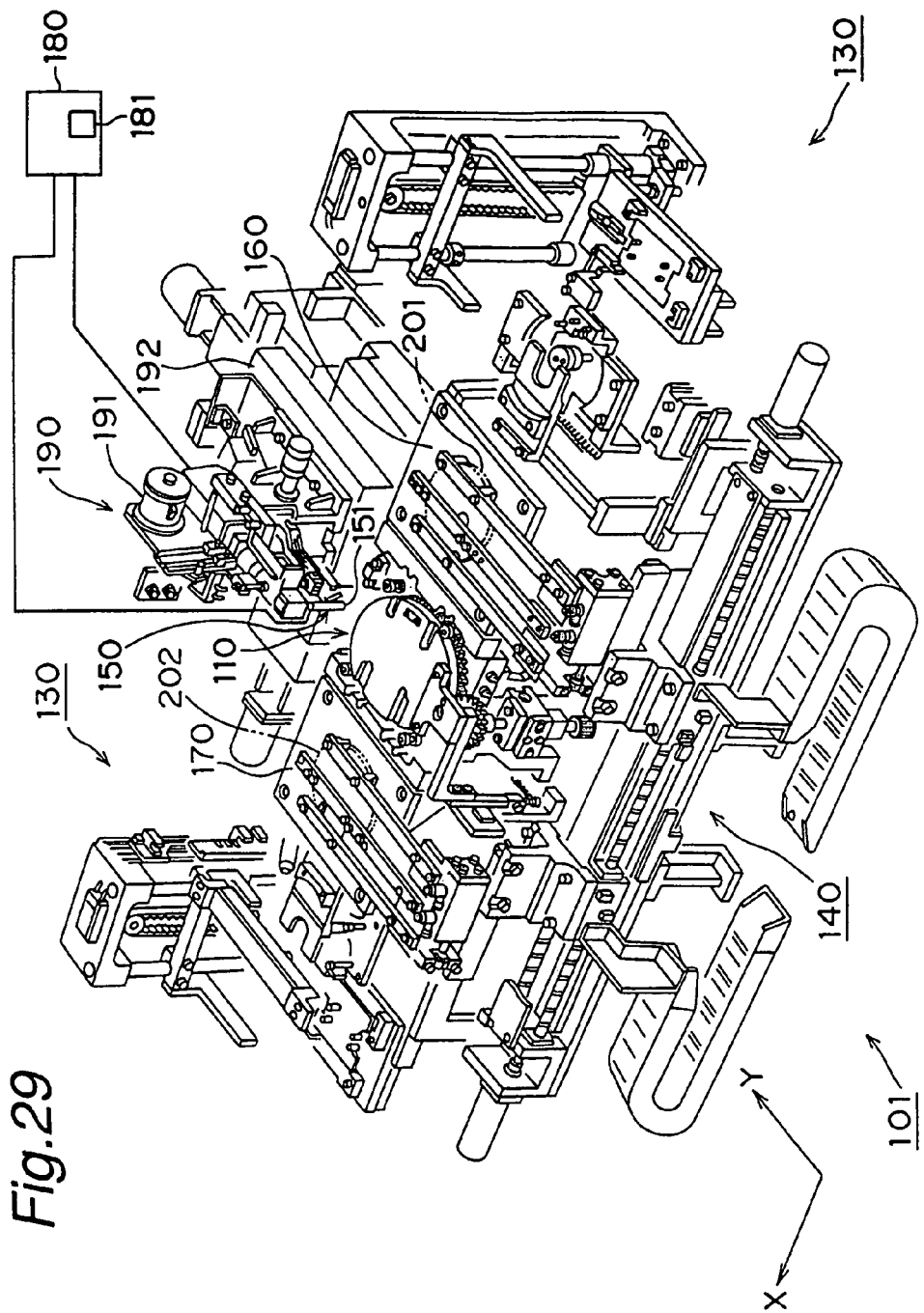
FIG. 29 is a perspective view of a bump forming apparatus of the embodiment for executing the bump formation method of FIG. 1.

The bump forming apparatus for a semiconductor wafer which performs the above bump formation method for the semiconductor wafer is schematically shown in FIG. 29. Bump forming apparatus 101 comprises one heating device 110 for bump bonding, a recognition device 150, a control device 180, and one bump forming head 190 corresponding to one example of a bump bonding apparatus. The bump forming apparatus preferably includes carriers 130, transfer devices 140 arranged respectively on a carry-in side and a carry-out side, a preheating device 160, and a post-heating device 170.

Figure 30:
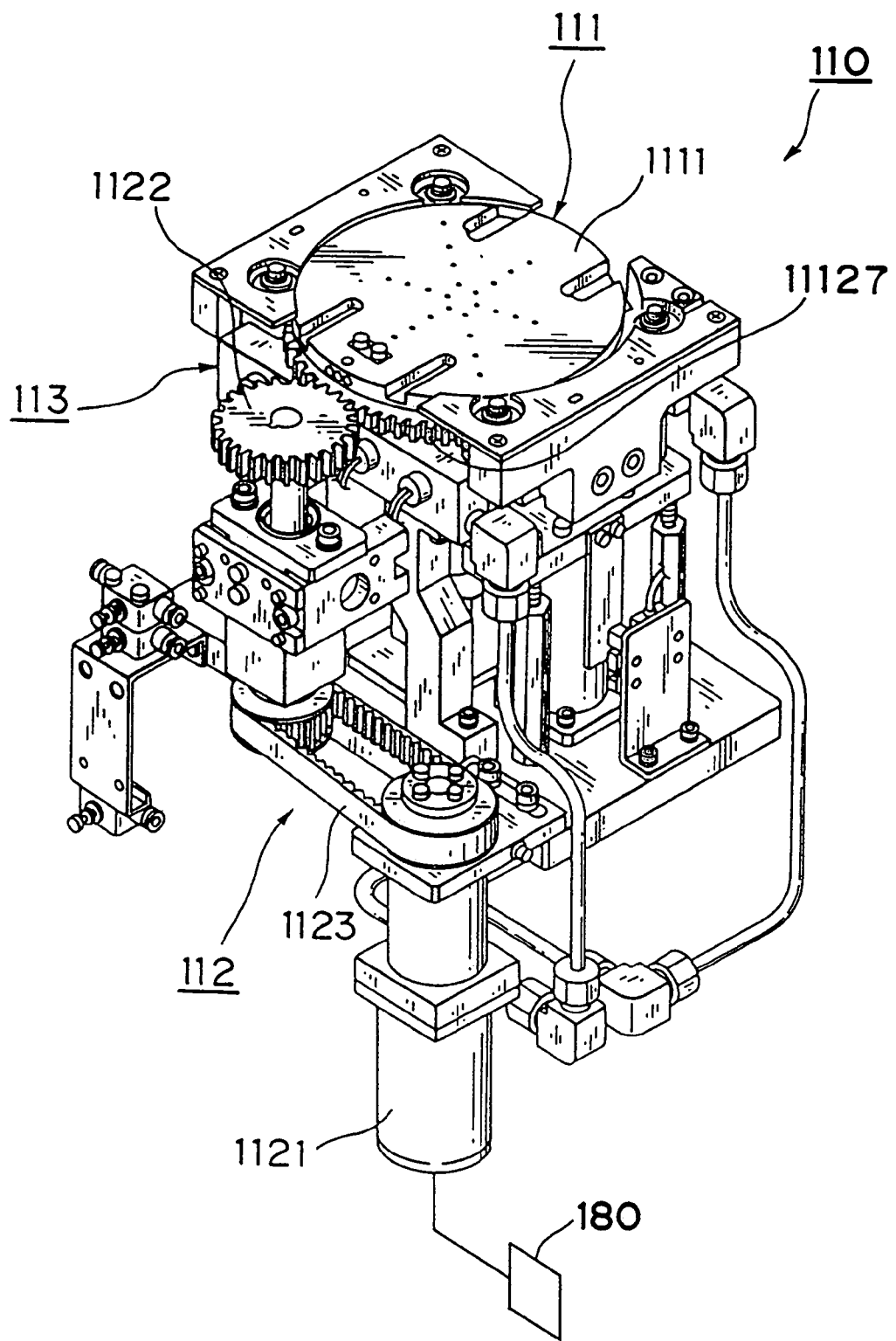
FIG. 30 is a perspective view of a heating device for bonding shown in FIG. 29.

The heating device 110 for bump bonding is roughly comprised of, as shown in FIG. 30, a wafer turning member 111, a turning device 112, and a wafer heater 113. The heating device 110 holds on the wafer turning member 111 a semiconductor wafer 201 without bumps formed thereon, which is to be subjected to bump bonding, and heats this loaded semiconductor wafer 201 by the wafer heater 113 to a bump bonding temperature which is approximately 150° C. in the embodiment. A semiconductor wafer, after bumps are formed by the bump forming head 190 on electrodes of ICs on the semiconductor wafer 201, will be denoted as a bump-formed wafer 202.

The wafer turning member 111 has a metallic disc wafer stage 1111 of a larger diameter than a diameter of the semiconductor wafer 201 for loading the semiconductor wafer 201 thereon, and a metallic disc turntable 1112 of a nearly equal size as a size of the wafer stage 1111 having teeth 11127 formed on an entire circumference thereof to be meshed with a gear 1122, to be described later, of the turning device 112.

The turning device 112 is a device for turning the wafer turning member 111 with the semiconductor wafer 201 loaded thereon in a circumferential direction of the semiconductor wafer 201. In the present embodiment, the turning device 112 has as a driving source 1121 a servo motor which is controlled by the control device 180, the gear 1122 to be meshed with the teeth 11127 of the turntable 1112, and a rotational force transmission mechanism 1123 for transmitting a driving force generated by the driving source 1121 to the gear 1122, thereby rotating the gear 1122 while preventing heat of the turntable 1112 from being conducted to the driving source 1121. Although a timing belt is used as the rotational force transmission mechanism 1123 in the embodiment, the transmission mechanism is not limited to this structure.

As described hereinabove, since the semiconductor wafer 201 is turned via the driving source 1121, the rotational force transmission mechanism 1123, the gear 1122, teeth 11127 of the turntable 1122, and the wafer stage 1111, a turning angle of the semiconductor wafer is controlled by the control device 180, thereby enabling the semiconductor wafer 201 to be turned by any angle.

The recognition camera 150, with an image pickup camera 151, detects a position of an IC and an inclination relative to a reference line of the IC on the basis of image pickup information of the image pickup camera 151. The image pickup camera 151, which is freely movable in row and column directions above the semiconductor wafer 201, picks up images of marks 224 and 2232-2234 for detection on the semiconductor wafer. The recognition device 150 is connected to the control device 180. The control device 180 controls the turning device 112 on the basis of detected inclination information, thereby controlling a quantity of a turn of the wafer turning member 111.

The bump forming head 190 is a device for forming bumps onto electrodes of the ICs on the semiconductor wafer 201 loaded on the wafer turning member 111 of the heating device 110 and heated to a bump bonding temperature. The bump forming head 190 includes, in addition to a wire supply part 191 for supplying a gold wire as material for a bump, a bump formation part for melting the gold wire to form a melted ball and pressing the melted ball to an electrode, an ultrasonic wave generation part for applying ultrasonic waves to the bump at a pressing time, and the like. The thus-constituted bump forming head 190 is attached on an X, Y table 192 which has, e.g., a ball screw structure and is movable in mutually orthogonal X and Y directions in a plane. The bump forming head 190 is moved in the X, Y directions by the X, Y table 192 so as to be able to form bumps on electrodes of each IC of fixed semiconductor wafer 201.

The carriers 130 are devices for removing the semiconductor wafer 201 from a first storage container in which the semiconductor wafer 201 is stored, and for transferring bump-formed wafer 202 to a second storage container which is to store the bump-formed wafer 202.

One of the transfer devices 140 receives the semiconductor wafer 201 from one of the carriers 130, then transfers the wafer 201 to the preheating device 160, and moreover transfers the wafer 201 from the preheating device 160 to the heating device 110 for bump bonding. The other transfer device 140 transfers the bump-formed wafer 202 from the wafer stage 1111 to the post-heating device 170 and delivers the wafer 202 from the post-heating device 170 to another of the carriers 130.

The preheating device 160 is a device for raising a temperature of the semiconductor wafer 201 loaded thereon from room temperature to a bump bonding temperature, at which bumps are formed, by the heating device 110.

The post-heating device 170 is a device for gradually decreasing a temperature of the bump-formed wafer 202 loaded thereon from the bump bonding temperature to near room temperature.

The control device 180 controls each part constituting the bump forming apparatus 101 of the above constitution, thereby controlling the bump formation method, including the aforementioned first-third operations, to be described in detail below.

The bump formation method performed by the above-constituted bump forming apparatus 101 will be described hereinbelow. The bump formation method is executed by control performed by the control device 180. Processing and transfer operations of the semiconductor wafer 201 from the first storage container to the heating device 110, and processing and transfer operations of the bump-formed wafer 202 from the heating device 110 to the second storage container, after bumps are formed on the semiconductor wafer 201, are omitted from the following description. An operation up to an end of bump formation, after the semiconductor wafer 201 is loaded onto the wafer stage 1111 of the heating device 110, will be detailed below.

Figure 2:
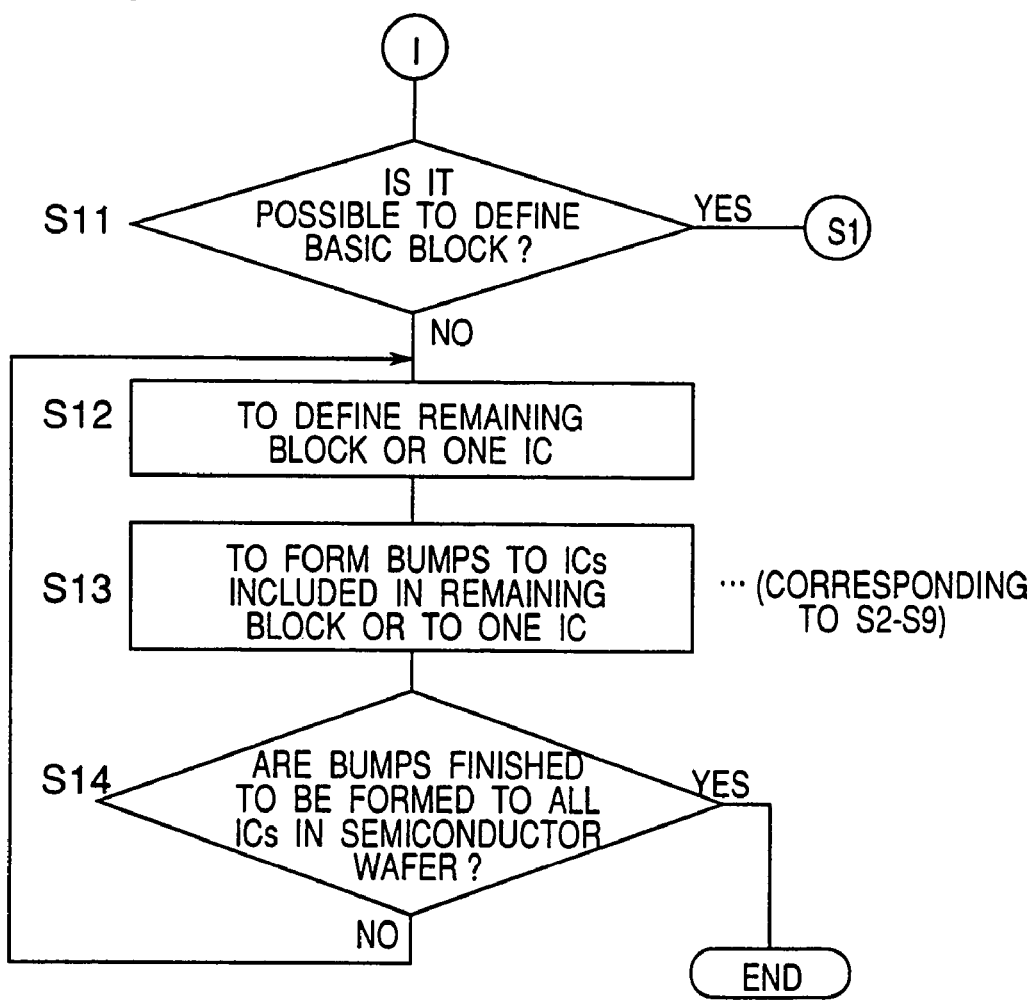
FIG. 2 is a flow chart showing operations of the bump formation method in the preferred embodiment of the present invention.

The bump formation method is briefly indicated in FIGS. 1-3, which will be discussed for each step (designated by "S" in the drawings).

An allowable range of a positional deviation of bumps on electrodes, when bumps are formed on the electrodes of an IC, is conventionally ±5 µm. A value of the allowable range is determined while thermal expansion or the like of the image pickup camera 151 and the bump forming head 190, because of heat heating semiconductor wafer 201 for bump formation, is taken into account. The allowable range of ±5 µm is a range which can be satisfied even when bumps are formed onto electrodes on a single IC having a size of 5-6 mm square. Therefore, with respect to a single IC having a size of 0.5 mm or 0.35 mm square these days, the allowable range can be fulfilled even if bumps are continuously formed on, e.g., approximately ten ICs, without executing positional recognition.

Therefore, according to the present embodiment, in step S1, a basic block is defined having a plurality of ICs adjacent each other in a row or column direction, or in row and column directions, from among ICs arranged in a grid pattern on the semiconductor wafer 201 to be subjected to bump bonding. Positional recognition is executed with respect to the basic block. Then, bumps are continuously formed on all ICs included in the basic block. So, a bump forming operation is carried out for every basic block. When bump formation is moved from one basic block to another basic block, from among basic blocks, positional recognition is executed with respect to the another basic block to form bumps on ICs included in the another basic block.

By adopting this method, the number of times of performing IC positional recognition can be reduced in comparison with the conventional art, in which a recognition operation is performed for every IC. Thus, productivity of forming bumps on a semiconductor wafer can be improved as compared with the conventional art.

The number of ICs for defining the above basic block is a value that, when bumps are continuously formed onto electrodes of all ICs in the basic block without executing positional recognition for each IC, all of positional deviations between the electrodes and bumps thereon is kept within an allowable range. Conversely, a single basic block is defined by such a number of ICs.

The number of rows and columns of ICs for forming the basic block is preliminarily stored in a memory part 181 in the control device 180.

Figure 4:
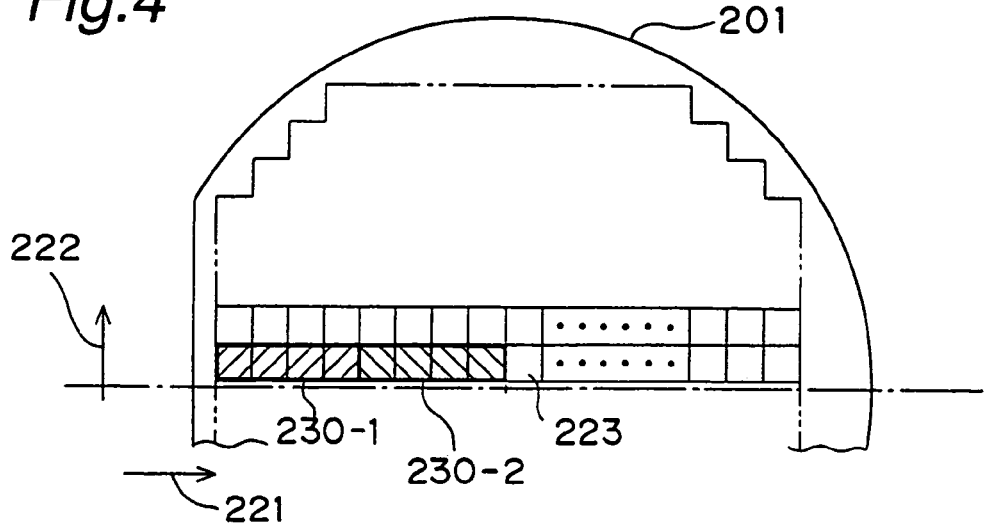
FIG. 4 is a diagram for explaining a basic block formed during the bump formation operation of FIGS. 1 and 2.

An operation for forming the basic block will be described below with reference to the drawings. As shown in FIG. 4, the semiconductor wafer 201 loaded on the wafer stage 1111, and sucked to the wafer stage 1111, in the embodiment has a plurality of ICs 223 arranged in a grid pattern along a row direction 221 and a column direction 222. The control device 180 forms basic blocks 230 starting from IC 223 where bump formation is to be started in accordance with a stored number of rows and columns of ICs for defining the basic block. For example, as shown in FIG. 4 the control device 180 forms basic blocks 230-1, 230-2, . . . , of, e.g., one row and four columns from, e.g., a circumferential edge portion of a central part of the semiconductor wafer 201.

Figure 6:
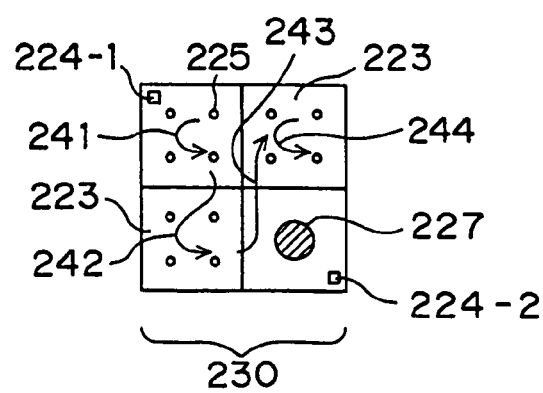
FIG. 6 is a diagram showing a different form of the basic block of FIG. 4, and a form of a bad mark.

A position where bump formation is to be started is not restricted to the aforementioned position. Also, the number of rows and columns of ICs for defining the basic block is not limited to the above, and the basic block may be defined, for instance, by a plurality of rows and a plurality of columns as shown in FIG. 6, or may be defined by a plurality of rows and one column.

Figure 7:
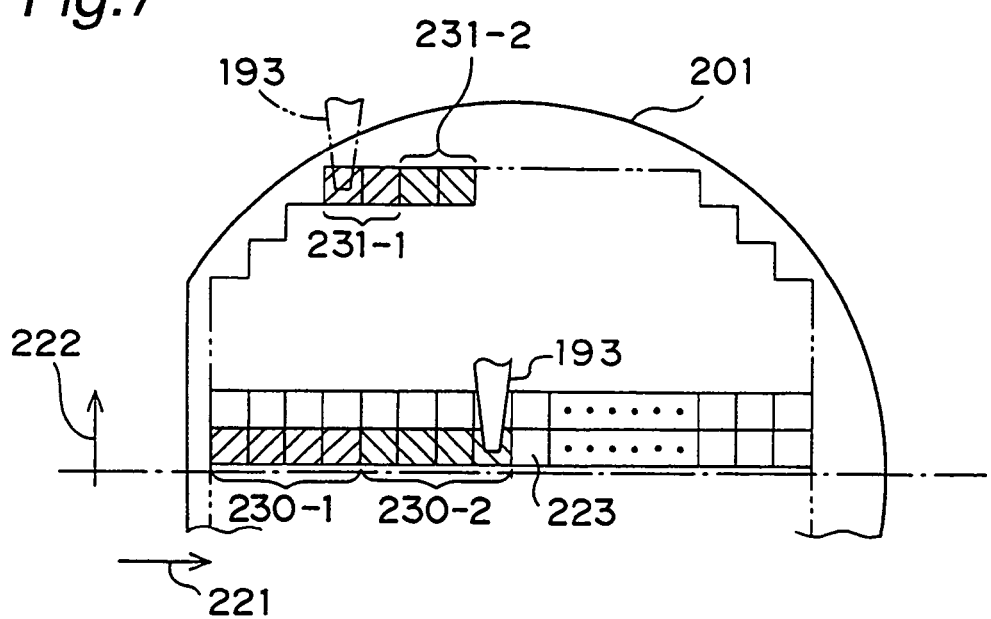
FIG. 7 is a diagram for explaining changing a number of ICs for defining the basic block in accordance with a bump formation position on the semiconductor wafer for the basic block of FIG. 4.

The number of rows and columns of ICs in the basic block 230 is not limited to a constant value and can be changed. For example, while the ultrasonic wave generation part of the bump forming head 190 is partly positioned above the wafer stage 1111 at a circumferential edge portion of the semiconductor wafer 201, another part is positioned away from the wafer stage 1111, and consequently, a thermal effect of the ultrasonic wave generation part becomes uneven in some cases because the wafer stage 1111 is heated to form bumps as described earlier. As such, for a position, e.g., the circumferential edge portion of the semiconductor wafer 201 where a thermal effect is not even to, e.g., a horn part 193 of the ultrasonic wave generation part of the bump forming head 190 as shown in FIG. 7, the basic block can be defined by one row and two columns like basic blocks 231-1, 231-2. On the other hand, for a position, e.g., a central portion of the semiconductor wafer 201 where a thermal effect is relatively even, the basic block can be defined by one row and four columns as in basic blocks 230-1, 230-2.

Figure 8:
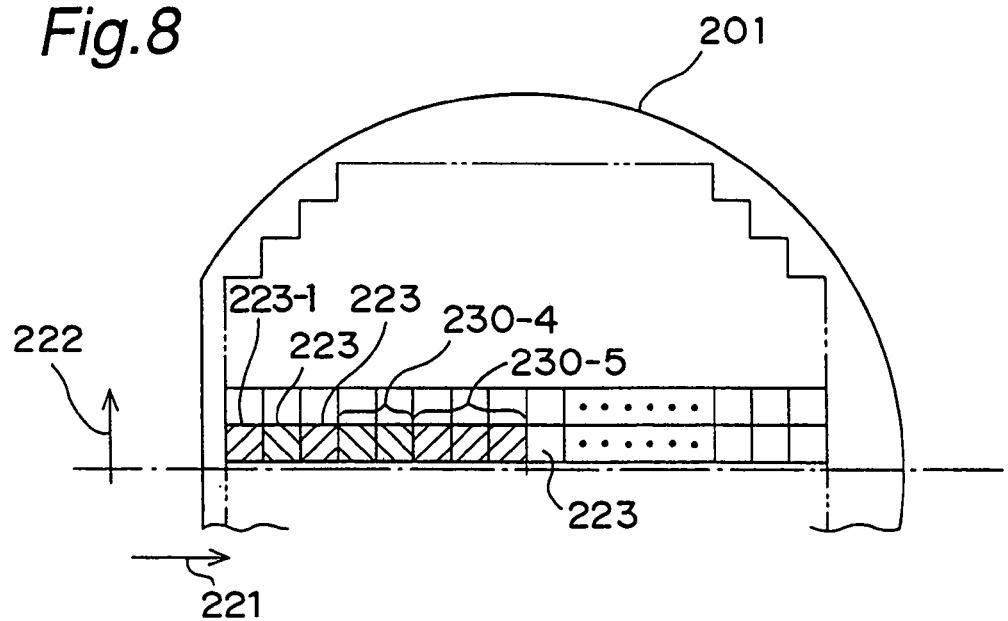
FIG. 8 is a diagram for explaining changing a number of ICs for defining the basic block of FIG. 4.

As indicated in FIG. 8, in a case where bump formation is started from, e.g., an IC 223-1, basic blocks 230 may not be formed while a lapse of time from a start of bump formation is short, and basic blocks 230 are formed as passed time is longer. That is, the number of rows and columns of ICs may be increased to a certain constant value such as, e.g., in a basic block 230-4 of one row and two columns, and a basic block 230-5 of one row and three columns.

Figure 9:
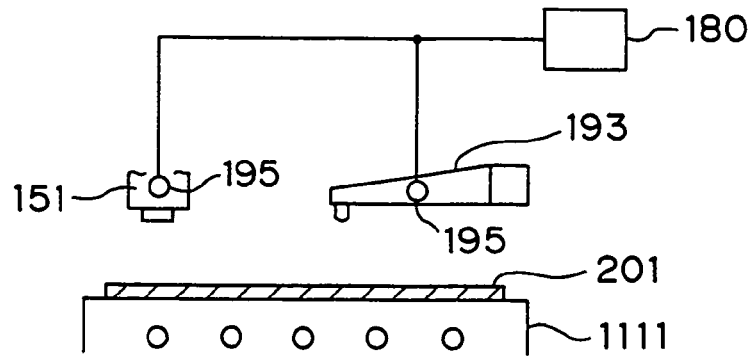
FIG. 9 is a diagram of a state in which a sensor for measuring a temperature above the semiconductor wafer, or the like, is installed on a horn part and an image pickup camera so as to change a number of ICs for defining a basic block.

A temperature sensor of, e.g., a thermocouple or strain sensor 195 may be attached to at least either the horn part 193 of the bump forming head 190 or the image pickup camera 151 as shown in FIG. 9, so that the control device 180 may determine the number of rows and columns of ICs in the basic block 230 on the basis of output information of the sensor 195.

Alternatively, the number of rows and columns of ICs of the basic block 230 may be determined by a position of the ICs 223 on the semiconductor wafer 201 where bumps are to be formed, or the number of rows and columns of ICs may be forcibly determined or changed.

Defining the basic block 230 in the control device 180 is carried out in a manner as follows, in the embodiment. As similar to the conventional art, the control device 180 has a program for bump formation stored in the memory part 181 for each of all ICs 223 formed on the semiconductor wafer 201. Positional information of every two marks 224 for positional recognition present on each IC 223 indicating an arrangement position of the IC 223, positional information of each electrode 225 present on each IC 223, and information of a bump formation order for the electrodes 225 present on one IC 223, and the like are described in the program. The control device 180, by utilizing the program for bump formation, executes a bump formation operation while taking a region of the above-determined number of rows and columns of ICs as the basic block 230.

In other words, with respect to one unit defining one basic block 230, forming a fresh program which represents positional information of the basic block, positional information of electrodes in the basic block, and the like is not executed. The existing program for bump formation is utilized to form bumps. A need of correcting or reforming the program is accordingly eliminated even if the number of rows and columns of ICs of the basic block 230 is changed, thereby facilitating adaptation with a high degree of freedom.

Figure 5:
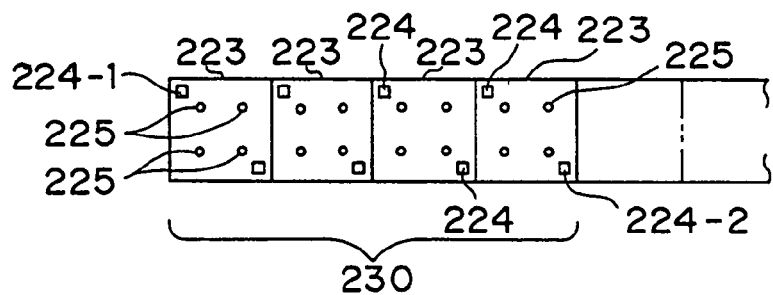
FIG. 5 is an enlarged view of one basic block of FIG. 4.

After the control device 180 determines the basic blocks 230 as above, in step S2, positional recognition is performed for the basic block 230, including ICs 223 on which bumps are to be formed. Each of the ICs 223 constituting the basic block 230 has two marks 224 for positional recognition as mentioned above. In the embodiment, first, one of two marks 224 for positional recognition corresponding to diagonal positions of the basic block 230, from among marks 224 of the ICs 223 present at both ends of the basic block 230, is imaged by the image pickup camera 151 of the recognition device 150. For example, in the basic block 230 shown in FIG. 5 a first mark 224-1 for positional recognition, of two marks 224-1 and 224-2 for positional recognition corresponding to diagonal positions, is imaged.

In next step S3, it is determined whether or not information for positional correction of the ICs 223 is already obtained and an inclination of the ICs 223 is already corrected when the semiconductor wafer 201 is placed on the wafer stage 1111. Although an operation of obtaining the information for positional correction for the ICs 223 and correcting the inclination of the ICs 223 which are determined in step S3 will be described in detail later, in a case where the ICs 223 are already corrected, particularly in inclination, operation of next step S4 can be eliminated. Accordingly, the number of times of performing a recognition operation is reduced and productivity is improved. On the other hand, if inclination is not yet corrected, the method proceeds to next step S4.

In step S4, the image pickup camera 151 of the recognition device 150 images remaining second mark 224-2 for positional recognition of the two position recognition marks 224-1 and 224-2. Based on positional information of the two position recognition marks 224-1 and 224-2, the control device 180 obtains a position and an inclination of the basic block 230 according to a known arithmetic method.

In the present embodiment, position recognition marks 224-1 and 224-2 present at both ends of the basic block 230 are employed in steps S2 and S4. Although using the position recognition marks 224 present at diagonal positions is preferred, particularly from a viewpoint of obtaining inclination information of the basic block 230, position recognition marks 224 to be used are not limited to the position recognition marks 224-1 and 224-2 present at both ends of the basic block 230, and any different two marks can be selected to be the position recognition marks.

In succeeding step S5, on the basis of the above inclination information of the basic block 230 which is obtained during step S2 or during steps S2 and S4, the control device 180 controls the turning device 112 of the heating device 110 to turn the wafer stage 1111 so that the IC 223 becomes parallel to a reference line, e.g., the X direction or Y direction. At this time, the wafer stage 1111 can be turned by any angle because the present embodiment adopts a constitution including the wafer turning member 111 and the turning device 112 as described before.

The control device 180 controls a quantity of movement of the X, Y table 192 of the bump forming head 190, based on the above positional information of the basic block 230, when bumps are to be formed.

Figure 10:
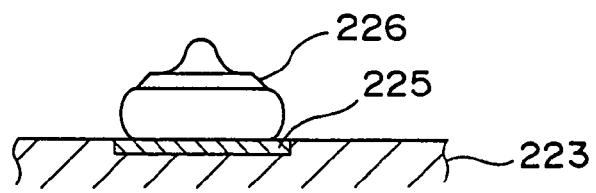
FIG. 10 is a diagram showing a state with a bump formed on an electrode.

During following step S6, the control device 180 controls the bump forming head 190, based on a program for bump formation, with respect to the semiconductor wafer 201 loaded and sucked onto the wafer stage 1111 and also heated to a bonding temperature, thereby forming bumps 226 as shown in FIG. 10 onto each of electrodes 225 of the ICs 223 included in the basic block 230.

Bumps are continuously formed during the bump formation operation without performing positional recognition of IC 223 for all ICs 223 included in one basic block 230. Without a positional recognition operation executed for each of the ICs 223 according to the embodiment, the number of times of performing positional recognition is reduced in comparison with the conventional art, thus enabling productivity to be improved.

Step S7 is performed together with bump formation after the bumps 226 are started to be formed.

Figure 11:
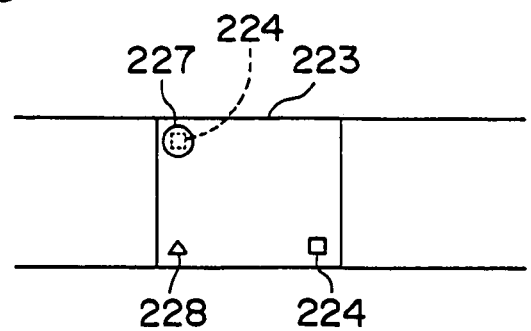
FIG. 11 is a diagram explanatory of a mark for positional correction, which is applied to an IC.

During the aforementioned step S7, it is determined whether or not a bad mark, applied to the ICs 223 included in the basic block 230 to which the bump formation is being performed, is to be detected. The bad mark is applied, e.g., during an inspection after a wiring pattern recognition process which is performed before the bumps are formed onto the electrodes 225, and is a mark for indicating a defective IC not functioning as an IC. The bad mark is applied to a nearly central part of the IC 223 as shown by numeral 227 in FIG. 6, or applied over-lapping with one of two position recognition marks 224 of IC 223 as shown in FIG. 11. The bad mark is formed at any position on the IC 223. In a case where the bad mark 227 is formed overlapping with position recognition mark 224, it becomes impossible to recognize the position recognition mark 224. Therefore, with utilization of such non-recognition, it can be determined that the IC 223 or basic block 230 is a defective IC or defective block if the position recognition mark 224 cannot be recognized. However, bad marks 227 might be included on other ICs 223 in the basic block 230 in some cases when the bad mark 227 is not detected at the position recognition mark 224 of the basic block 230. Therefore, detection for the bad mark 227 is preferably performed for other ICs 223 as well.

The presence/absence of the bad mark is detected by imaging the ICs 223 by the image pickup camera 151 in the embodiment.

In a case where the bad mark 227 is applied to one of two position recognition marks 224-1 and 224-2 to be recognized in the basic block 230, and when the bad mark is actually detected, positional recognition with respect to other basic blocks 230 may be started without forming bumps for the subject basic block 230. However, some of the ICs 223 constituting the basic block 230 which are detected to include the bad mark 227 may be good ICs. In order not to waste good ICs, even if one of the position recognition marks 224-1 and 224-2 imaged for the positional recognition of the basic block 230 has the bad mark 227, it is preferable to make a determination for each of the ICs 223 included in the basic block 230 as to whether or not the bad mark 227 is applied thereto, as shown in steps S811-S813 in FIG. 13.

Figure 13:
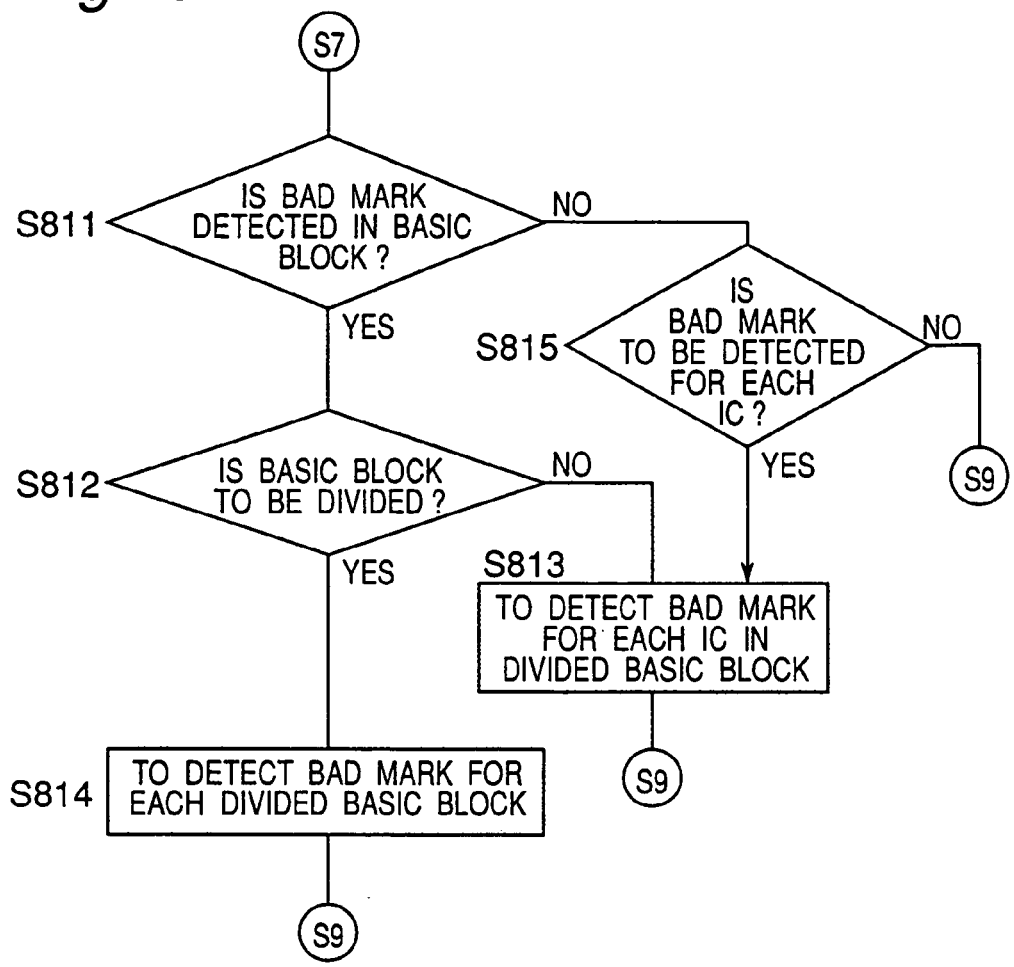
FIG. 13 is a flow chart for explaining a detailed operation of the bad mark detection shown in FIG. 1.

Suppose that the basic block 230 is defined by, e.g., six ICs 223 of one row and six columns, when the basic block 230 is detected through positional recognition to include the bad mark 227, it may be so arranged as shown in step S814 of FIG. 13 that the presence/absence of the bad mark 227 is recognized for each of divided basic blocks which are obtained by more finely dividing the subject basic block 230 in place of immediately determining the presence/absence of the bad mark 227 for each IC 223 in the basic block as above. If the bad mark 227 is detected in a divided basic block, the presence/absence of the bad mark 227 is recognized for a next divided basic block or next basic block. Operation of step S814 is effective when two position recognition marks 224 are to be recognized for the basic block 230.

Alternatively, the IC 223 detected to include the bad mark 227 may be separated from the basic block 230 so as not to form bumps on this IC 223 with the bad mark, and positional recognition of the basic block 230 may be executed with a next, e.g., adjoining IC 223.

The following description of a bad mark detection operation exemplifies a case of determining a presence/absence of bad mark 227 for every one of all ICs 223 in the basic block 230.

When the bad mark is to be detected, the method proceeds to next step S8, where the bad mark is detected. The control device 180 stops forming bumps on the IC 223 determined to have the bad mark and moves to detect a bad mark for a next IC 223. A time required for forming bumps on the IC 223 with the bad mark, which is useless, can be cut by this operation and productivity can be improved.

On the other hand, when the bad mark is not to be detected, the method proceeds to step S9 while bumps are formed on all ICs 223 included in the basic block 230.

When inclination correction for the semiconductor wafer 201 is already executed, which is determined during the above-described step S3, and when the bad mark 227 is formed overlapping with one positional recognition mark 224, an operation to be described below may be performed during step S8 with reference to FIG. 12. It becomes impossible to recognize the position recognition mark 224 when the bad mark 227 is formed overlapping therewith, and eventually it becomes impossible to recognize a position of the IC 223 or basic block 230. For avoiding this, with respect to each IC 223, it is necessary to treat, in addition to the position recognition mark 224, an arbitrary point in a circuit pattern on the IC 223 as a mark 228 for positional correction to substitute for the position recognition mark 224 as shown in FIG. 11. The mark 228 for positional correction is illustrated to be triangular in FIG. 11 for the sake of convenience. Although the mark 228 for positional correction may be formed separately on the IC 223, it is simpler and preferable to register an arbitrary point in the circuit pattern of the IC 223 into a program as the position correction mark 228.

Figure 12:
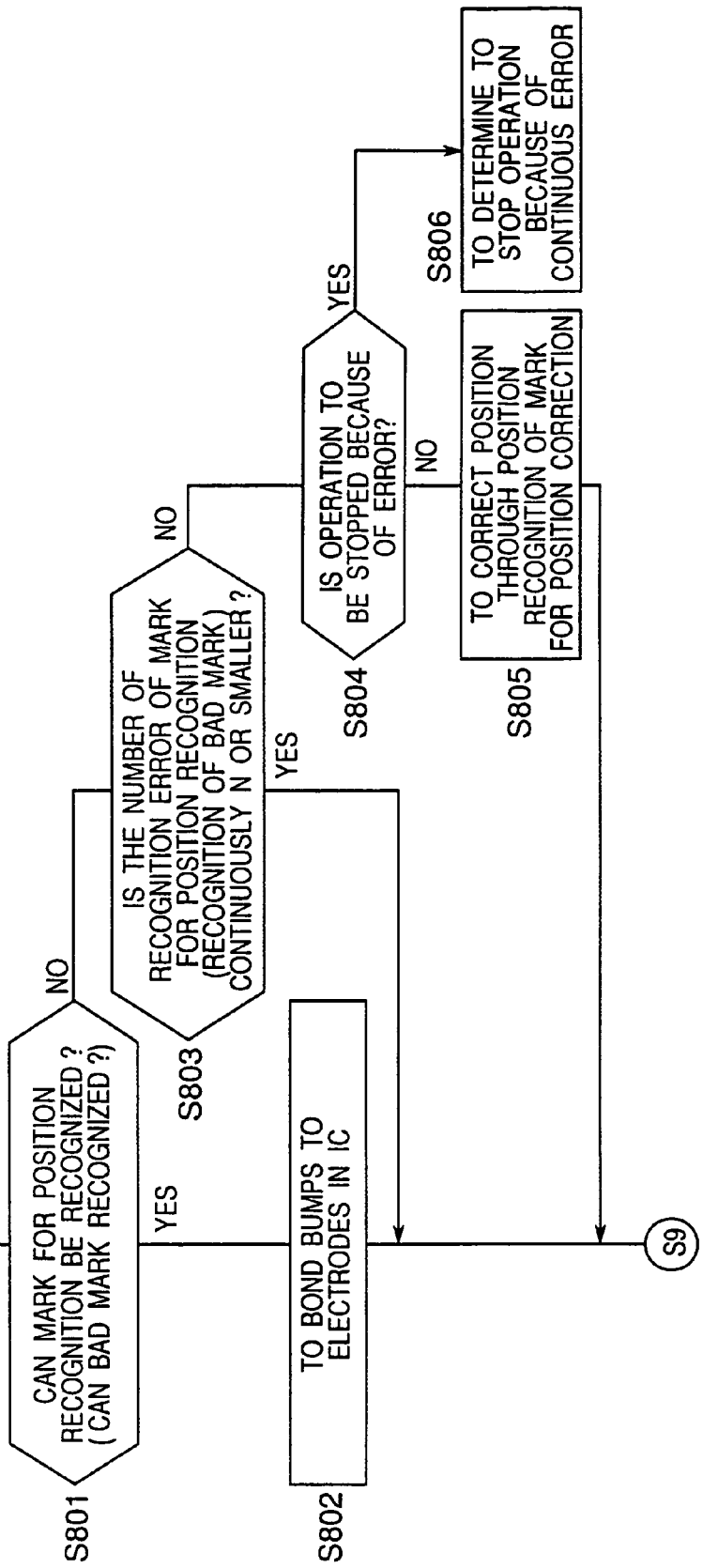
FIG. 12 is a flow chart for explaining a detailed operation of bad mark detection shown in FIG. 1.

Regarding FIG. 12 showing operation of step S8 in detail, during step S801, the control device 180 controls the recognition device 150 to recognize one position recognition mark 224 of the IC 223 included in the basic block 230 as described earlier. When this position recognition mark 224 can be recognized, in other words, when the IC 223 includes no bad mark, the method proceeds to step S802, during which the control device 180 controls the bump forming head 190 to form bumps 226 on electrodes 225 of the IC 223.

Meanwhile, when the position recognition mark 224 cannot be recognized in step S801, that is, when the IC 223 has the bad mark, the method proceeds to step S803 and the control device 180 determines whether or not the number of counts that the position recognition mark 224 cannot be recognized is n or less. In other words, an amount of defective ICs is continuously detected and determined.

In some cases, a position of a good IC cannot be determined even if the good IC is detected after many defective ICs are detected, or a quantity of a positional deviation between an electrode and a bump exceeds an allowable range even when bumps are formed on electrodes of the good IC. Therefore, the above number n is the number of ICs 223 of which at least the quantity of the positional deviation between the electrode 225 and the bump 226 of the IC 223 is accommodated within the allowable range. The number n is set in the control device 180 in advance.

When the number of counts for which the position recognition mark 224 cannot be recognized is not larger than n during step S803, the method proceeds to step S9. On the other hand, when the number of counts exceeds n, it is highly possible that the quantity of the positional deviation between the electrode 225 and the bump 226 of the IC 223 exceeds the allowable range as mentioned above. Then it is determined during step S804 whether or not the operation is to be stopped because of an error, and the operation is stopped during step S806 if it is so determined. Oppositely, if the operation is not to be stopped, the method proceeds to step S805 and the control device 180 controls the recognition device 150, thereby recognizing the position correction mark 228 and confirming a present position to correct this position. The method then proceeds to step S9.

Although it is so adapted in the embodiment as to actually detect the presence/absence of the bad mark 227 during steps S8, S801-S806 and S811-S814, bump formation may be executed on the basis of, e.g., positional data of defective ICs in an already processed semiconductor wafer. In this case, since positional data of defective ICs is hardly equal in all semiconductor wafers 201, it is preferable to detect a position of the bad mark 227 again and update positional information of the bad mark 227 for every constant number of wafers. The above constant number can be appropriately set by a manufacturer of the semiconductor wafer 201, a production lot of the semiconductor wafer, and the like.

Even when the bad mark 227 is not to be detected during step S811, step S815 may be performed to determine whether or not the bad mark 227 is to be detected for each of ICs 223 in the basic block 230. The method proceeds to step S9 when this detection is not to be performed, whereas the method proceeds to step S813 when the detection is to be performed.

During next step S9, it is determined whether or not bumps are already formed on all ICs 223 included in the basic block 230 subjected to bump formation. The method returns to step S6 if an IC 223 without bumps formed thereon is present. The method proceeds to step S10 when bumps 226 are formed on all ICs 223 in the basic block 230.

An example of bump formation order on all ICs 223 included in the basic block 230 is indicated in FIG. 6. The basic block 230 is defined by ICs 233 of two rows and two columns in FIG. 6. A bump 226 is formed on each of electrodes 225 in the order designated by arrows 241-244. The bump formation order is preferably such that bump formation is completed for every IC 223 included in the basic block 230 to an almost uniform bump formation state for one IC.

It is determined during step S10 whether or not bumps 226 are formed on all ICs 223 on the semiconductor wafer 201. The aforementioned all ICs 223 means all good ICs in a case of not forming bumps on defective ICs as referred to above.

The bump formation method for the semiconductor wafer 201 is terminated when bumps are formed on all ICs 223. On the other hand, the method proceeds to next step S11 if there are ICs 223 without bumps yet formed thereon.

Figure 14:
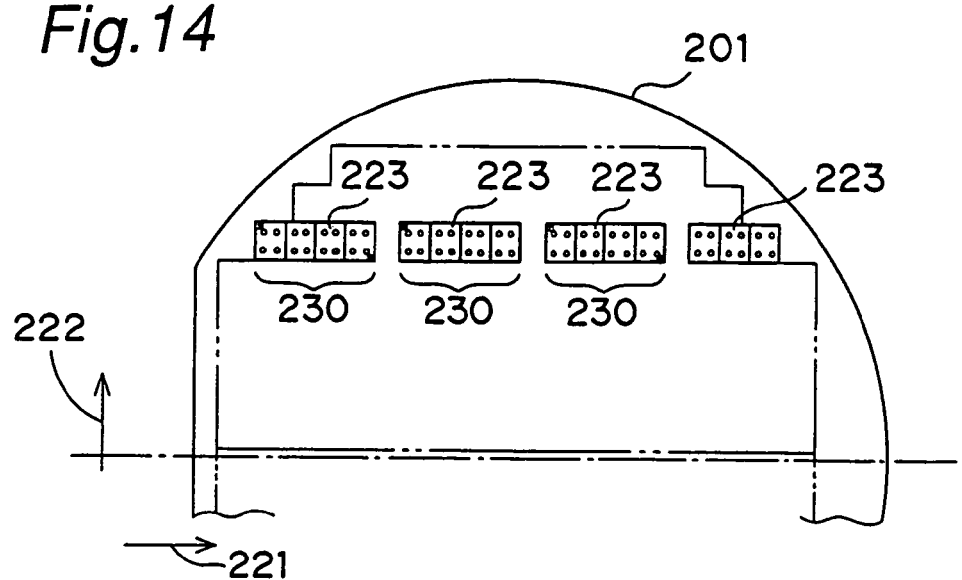
FIG. 14 is a diagram for explaining remaining ICs not in basic blocks.

A process related to the bump formation is completed for one basic block 230 through operations up to step S9. It is determined during step S11 whether or not further basic blocks 230 can be formed from the ICs 223 on the semiconductor wafer 201. Specifically, suppose that a certain row in the semiconductor wafer 201 includes, e.g., 15 ICs 223 as shown in FIG. 14, three basic blocks 230, e.g., each of one row and four columns can be formed and three ICs 223 are left in the row. These remaining three ICs 223 cannot form the basic block 230 of one row and four columns. That is, the basic block cannot always be defined by a set number of rows and columns of ICs.

When the basic block 230 can be formed of a set number of rows and columns of ICs, the method returns from step S11 to step S1 to perform a process related to bump formation as described above for defined basic blocks 230. However, if there are ICs 223 of a number not satisfying the set number of rows and columns, and consequently basic block 230 cannot be formed, the method proceeds from step S11 to next step S12. On the semiconductor wafer 201, a bonding boundary representing a region where bumps 226 can be formed is arranged along circumferential edge parts of ICs 223 on the wafer 201. The above number not satisfying the set number of rows and columns is a number which is obtained with respect to the ICs 223 included within the region delimited by the bonding boundary. ICs of a number not satisfying the number of rows and columns for constituting the basic block 230 in a certain row or column, or in a certain row and column, will be denoted as remaining ICs.

Figure 15:
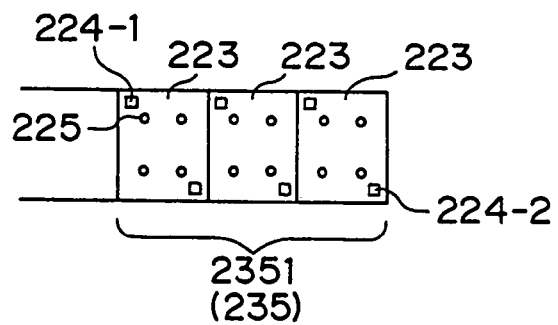
FIG. 15 is a diagram of a case where a block for remainder is defined by the remaining ICs of FIG. 14.
Figure 16:
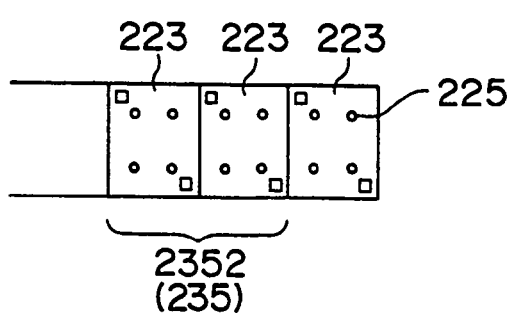
FIG. 16 is a diagram of a case where blocks for remainder are defined by the remaining ICs of FIG. 14.

The control device 180 determines during step S12 whether to perform the process related to bump formation by forming the ICs 223, of a number not satisfying the set number of rows and columns, into blocks, to execute the process related to the bump formation for every one of the ICs 223, or to execute the process related to the bump formation by a combination of the above. Specifically with reference to the above example, with respect to remaining ICs 223, one block 2351 for remainder is formed from all of the remaining ICs 223, namely, with the above three ICs 223 in this example as shown in FIG. 15, and then the process related to bump formation is performed for the block 2351. Alternatively, one block 2352 for remainder is formed from two ICs 223 as shown in FIG. 16 and then the process related to bump formation is performed for the block 2352, or the process related to the bump formation is performed individually for each of the remaining ICs 223.

Whether to define block 235 for remainder with respect to the remaining ICs 223, or to process the remaining ICs 223 one by one is preliminarily programmed in the control device 180. In a case of defining the block 235 for remainder, the number of rows and columns of ICs 223 for defining the block 235 for remainder with respect to the remaining ICs 223 may be automatically determined by the control device 180 or may be set beforehand.

During next step S13, the process related to bump formation which corresponds to operations of the above steps S2-S9 is executed either with respect to the block 235 for remainder or each of the remaining ICs 223, or with respect to the block 235 for remainder and each of the remaining ICs 223, which are constituted during step S12.

It is determined during next step S14 whether or not bumps 226 are completely formed on all ICs 223 on the semiconductor wafer 201. If there are ICs 223 having bumps not formed thereon, the method returns to step S12. On the contrary, when all ICs 223 have bumps 226 completely formed thereon, the bump formation operation for the semiconductor wafer 201 is finished. The semiconductor wafer 201 with the bumps 226 formed thereon is transferred and stored, as the bump-formed wafer 202, by the transfer device 140 and the carrier 130 in the second storage container.

An operation of obtaining information for positional correction of the ICs 223 formed on the semiconductor wafer 201, and of correcting inclination of the ICs 223 (referred to as a "wafer mark recognition operation" hereinafter), which is determined as to whether to have already been executed or not during the above-discussed step S3, will now be described with reference to FIG. 3 and the like. The wafer mark recognition operation is controlled by the control device 180.

During a process prior to forming bumps with the wafer 201 divided into blocks, if the wafer mark recognition operation is executed when the semiconductor wafer 201 is placed on the wafer stage 1111, the recognition operation for two position recognition marks 224-1 and 224-2, performed during steps S2 and S4, can be reduced to the recognition for either one mark, so that productivity is improved furthermore.

This will be more specifically described. A position of an IC formation pattern on the semiconductor wafer with respect to an outline of the semiconductor wafer 201, and an inclination of an arrangement in the row and column directions of ICs 223 forming the IC formation pattern with respect to reference lines corresponding to X and Y directions, i.e., the inclination of the ICs, are uniform within the same production lot of the semiconductor wafers 201. However, a positional difference and an inclination difference are actually present between two different production lots. As a result, bumps 226 may be positionally deviated from electrodes 225 if bump formation is always started from an equal position relative to the semiconductor wafers 201 of all production lots.

In order to prevent this, the position of the IC formation pattern with respect to the outline of the semiconductor wafer 201, and the inclination of ICs relative to the reference lines, are confirmed when the semiconductor wafer 201 is placed on the wafer stage 1111, thereby eliminating positional deviation of the bumps 226 relative to the electrodes 225.

Particularly in the bump forming apparatus 101 of the present embodiment, as described above, the semiconductor wafer 201 is turned with use of the wafer turning member 111 and the turning device 112 arranged at the heating device 110 via the driving source 1121, the rotational force transmission mechanism 1123, the gear 1122, the teeth 11127 of the turntable 1112 and the wafer stage 1111, with a turning angle being controlled by the control device 180, so that the semiconductor wafer 201 can be turned by any angle. In consequence, the wafer stage 1111 loading the semiconductor wafer 201 thereon can be highly accurately and easily turned on the basis of an angle of inclination of the ICs obtained by performing the wafer mark recognition operation. The angle of inclination of the ICs can be highly accurately and easily corrected accordingly.

Since a need of obtaining the angle of inclination of the ICs through a recognition operation of two position recognition marks 224-1 and 224-2 at a bump formation time is eliminated by correcting the angle of inclination of the ICs beforehand, it is enough to obtain only positional information of the IC formation pattern by performing a recognition operation of either one of the position recognition marks 224-1 and 224-2. The number of times of performing a recognition operation can hence be further reduced and productivity can be improved.

The above wafer mark recognition operation will be described in detail.

Figure 3:
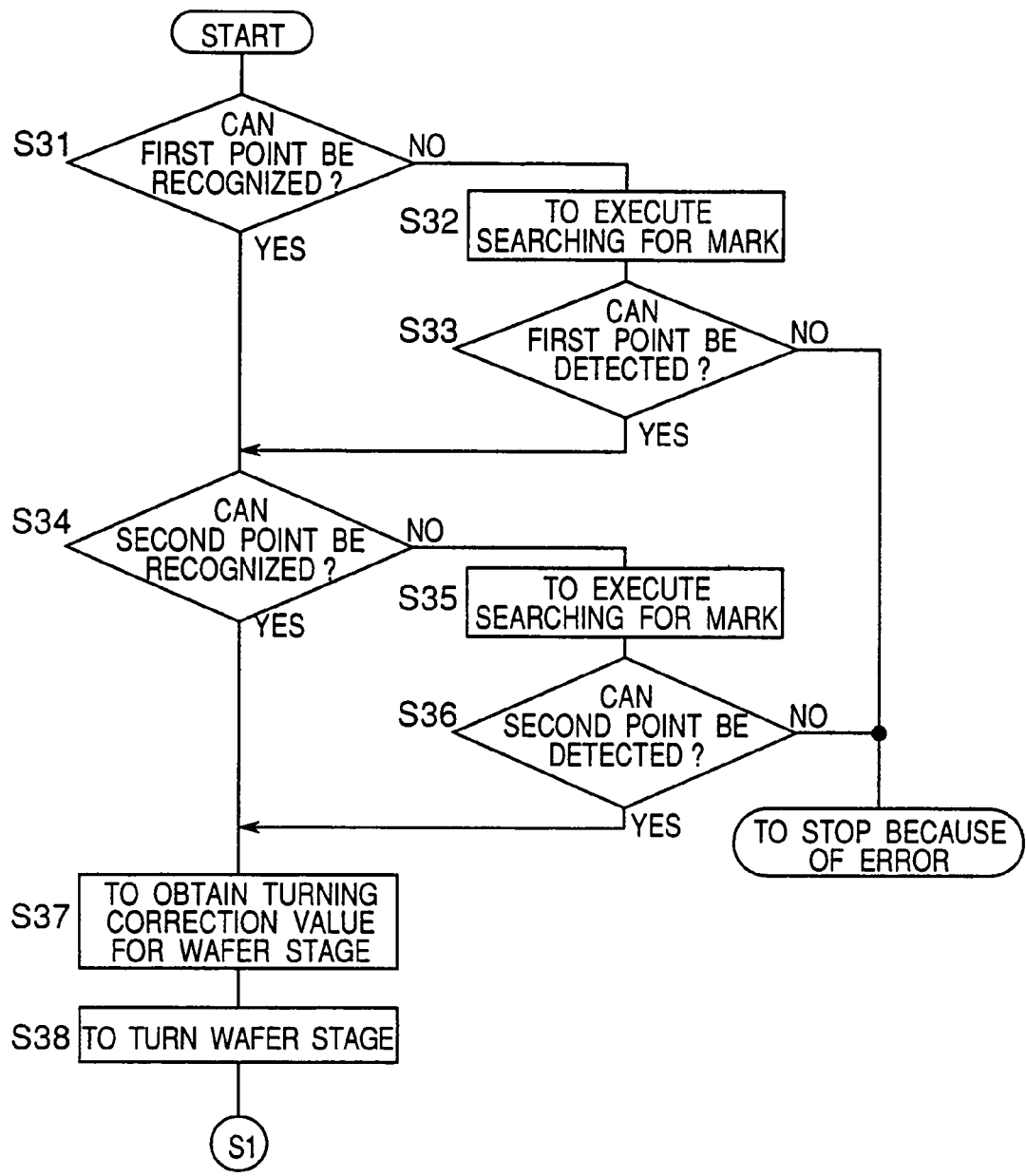
FIG. 3 is a flow chart showing an operation of detecting a position and an inclination of ICs of a semiconductor wafer, which can be performed before a bump formation operation of FIGS. 1 and 2.
Figure 17:
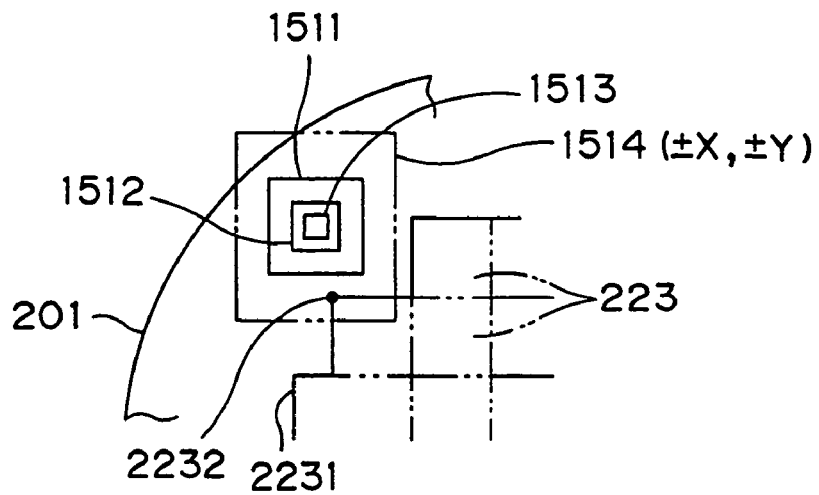
FIG. 17 is a diagram showing a view field, a maximum deviation area, and the like of an image pickup camera for explaining a search operation performed during step S32 of FIG. 3.

During step S31 shown in FIG. 3, it is determined whether or not a first point, from among characteristic points on the semiconductor wafer 201 loaded on the wafer stage 1111, is recognized by the image pickup camera 151 of the recognition device 150. In other words, it is necessary for executing the above wafer mark recognition operation to recognize by the image pickup camera 151 two arbitrary detection points for recognition which correspond to marks for detection on the semiconductor wafer 201. A first detection point for recognition, from among the above two detection points for recognition, is set in the control device 180 beforehand. As shown in FIG. 17, according to the embodiment, a corner part of an outline 2231 of the IC formation pattern formed at the circumferential edge part of the semiconductor wafer 201, on which ICs 223 are formed by a stepper, is set as a first detection point 2232 for recognition.

The image pickup camera 151 has a view field 1511 as indicated in FIG. 17, having a point to be recognized such as, e.g., the first detection point 2232 for recognition at a central position of the view field. The recognition device 150 can obtain a coordinates position of the point to be recognized if the point to be recognized is included in a cell 1512 for rough recognition inside the view field 1511, and moreover in a cell 1513 for fine recognition in the cell 1512.

In starting the wafer mark recognition operation, the image pickup camera 151 is positioned on the basis of coordinates data of the first detection point 2232 for recognition. However, the first detection point 2232 for recognition is not always included in the view field 1511 when the image pickup camera 151 first images the semiconductor wafer 201 because of a displacement or the like of the semiconductor wafer 201 when loaded on the wafer stage 1111. Therefore, it is determined during step S31 whether or not the first detection point 2232 for recognition can be recognized by the recognition device 150. When this detection point can be recognized, the method proceeds to next step S34. The method proceeds to step S32 if the detection point cannot be recognized.

If a true point to be recognized, i.e., the above first detection point 2232 for recognition, is present outside a maximum deviation area 1514 defined by four points with coordinates positions of ±x in the X direction and ±y in the Y direction from a central position of the view field 1511 for which the image pickup camera is positioned, it is impossible to recognize the first detection point 2232, thereby necessitating shifting the view field 1511. The maximum deviation area 1514 is a region beyond the view field 1511.

Figure 18:
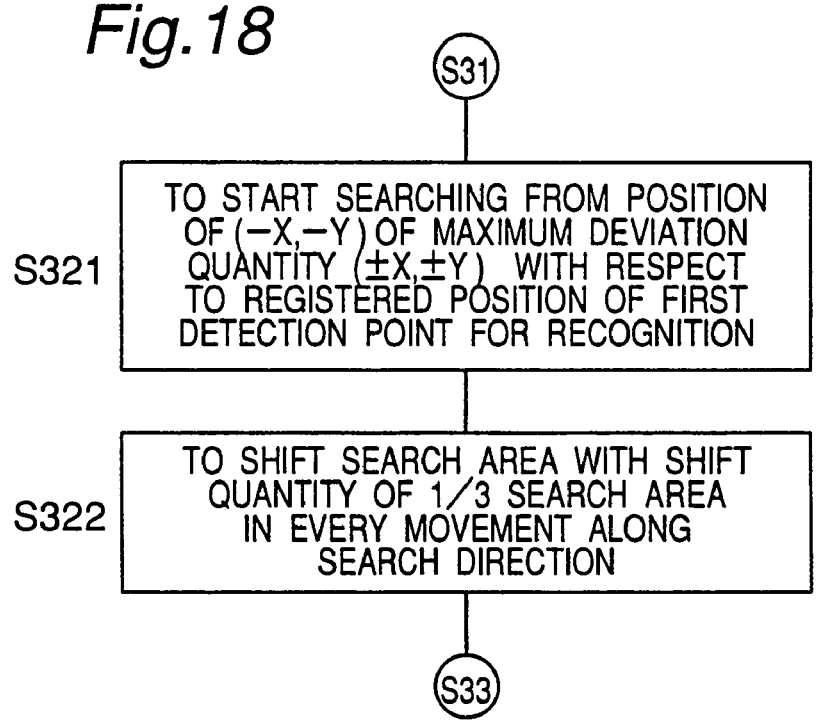
FIG. 18 is a flow chart for explaining one search operation performed during step S32 of FIG. 3.
Figure 19:
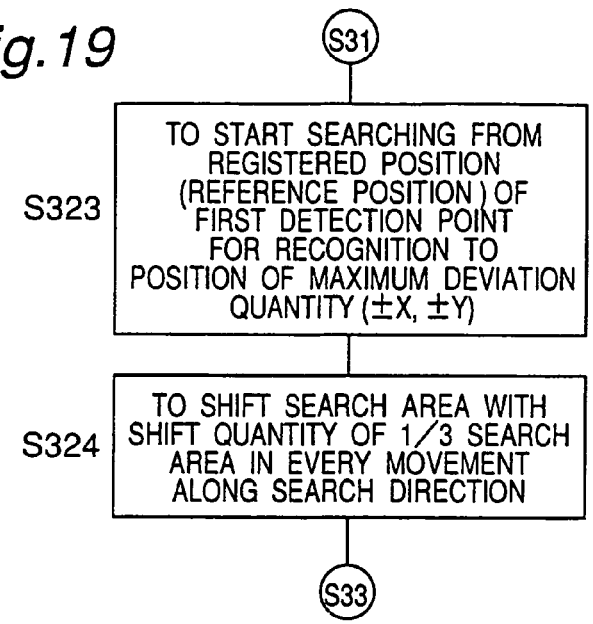
FIG. 19 is a flow chart for explaining another search operation performed in step S32 of FIG. 3.
Figure 20:
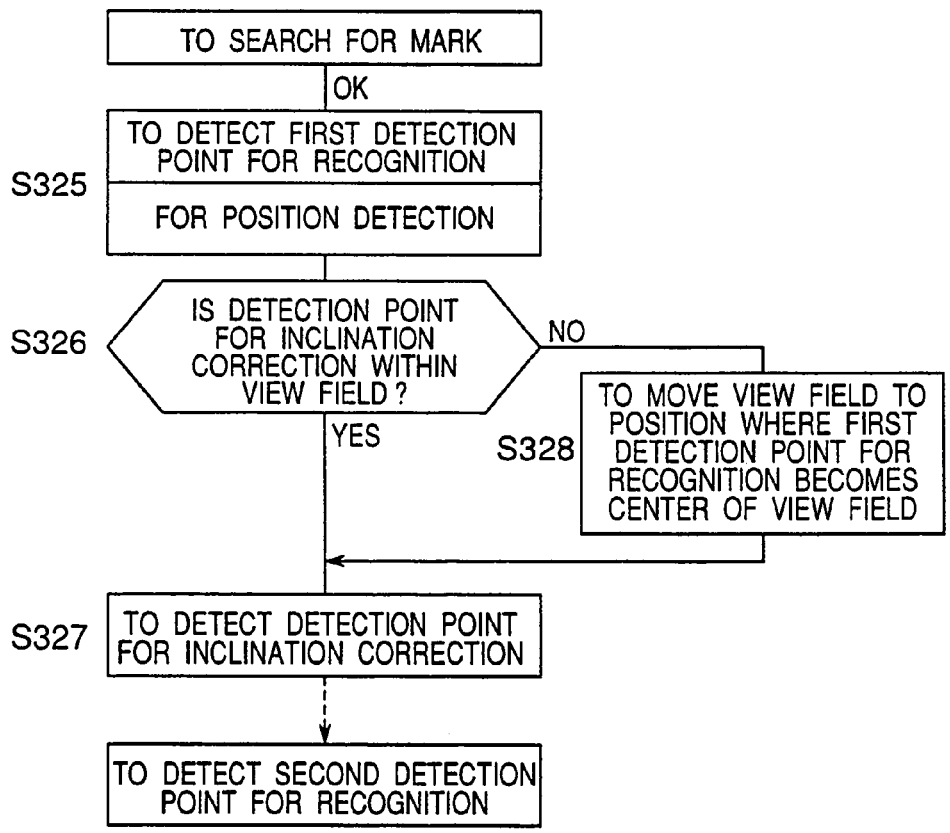
FIG. 20 is a flow chart for explaining a different search operation performed during step S32 of FIG. 3.

During step S32, one of three operations: that is, operation of searching for the first detection point 2232 shown in FIG. 18 or 19 (steps S321-S322 and steps S323-S324) operation of searching for the first detection point 2232; and operation of facilitating recognizing a second detection point, these latter two being shown in FIG. 20 (steps S325-S328), is performed. Each of these operations will be described below.

Figure 21:
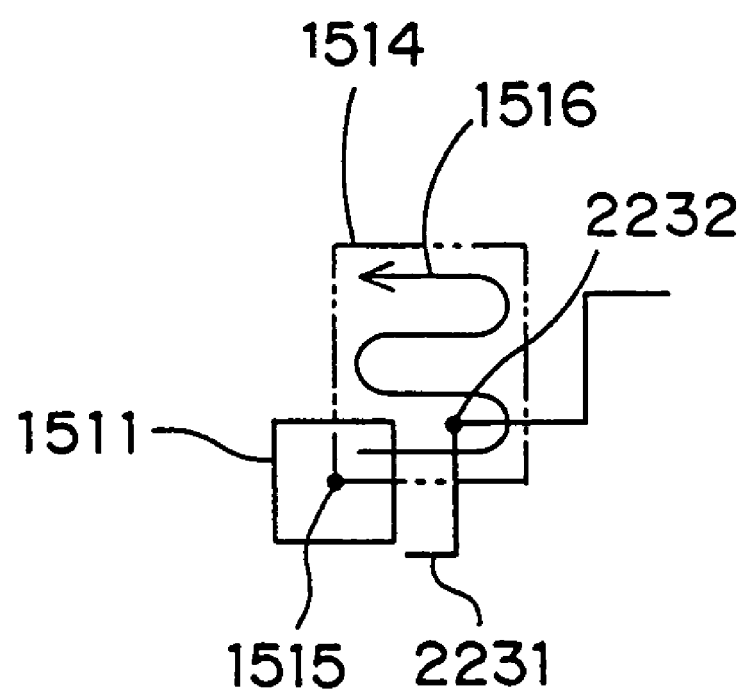
FIG. 21 is a diagram for explaining the search operation of FIG. 18.

In a search operation for the first detection point 2232 shown in FIG. 18, during step S321, the image pickup camera 151 starts a recognition operation from a search start position 1515 of (−x, −y), which are coordinates including one point from among four corners defining the maximum deviation area 1514 as shown in FIG. 21, on the basis of coordinates of the first detection point 2232 registered beforehand in a bump formation program.

As mentioned before, a position of a preliminarily registered first detection point 2232 is normally not coincident with a central position of the view field 1511 because of displacement or the like of the semiconductor wafer 201 when loaded, as is clearly shown in FIG. 21.

Although the search start position 1515 is set to the coordinates (−x, −y) in the embodiment, the position is not limited to this and may be any other of the three points of the four corners forming the maximum deviation area 1514.

The first detection point 2232 is searched for during next step S322 while the image pickup camera 151 is moved by every distance 1517 along the X and Y directions in a serpentine search direction 1516 within the maximum deviation area 1514 from the search start position 1515, for instance, by a predetermined distance in the X direction, then by a predetermined distance in the Y direction, then by a predetermined distance in a direction opposite to the X direction, then by a predetermined distance in the Y direction again, and then by a predetermined distance again in the X direction.

Figure 22:
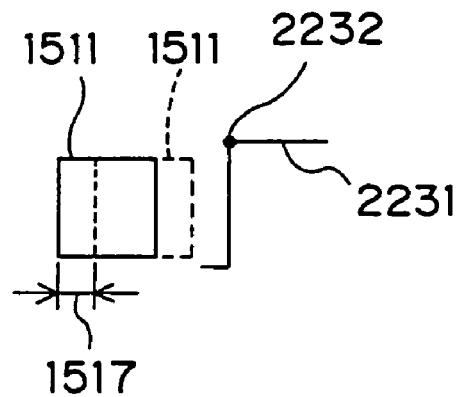
FIG. 22 is a diagram for explaining a quantity of movement of a view field of the search operation of FIG. 18.

The distance 1517 is set to be a distance corresponding to ⅓ a length in the X or Y direction of the view field 1511 in the embodiment as indicated in FIG. 22.

Moving the image pickup camera 151 in the serpentine fashion facilitates recognizing the search operation and its area, and setting the maximum deviation area 1514.

During the search operation performed during the steps S321, S322, the search start position 1515 for the first detection point 2232 is set to (−x, −y), which are position coordinates of one point from among four points defining the maximum deviation area 1514. Meanwhile, during the search operation for the first detection point 2232 indicated in FIG. 19, a search start position 1519 is set to coordinates of a center of the view field 1511 to search inside the maximum deviation area 1514 during step S323.

Figure 23:
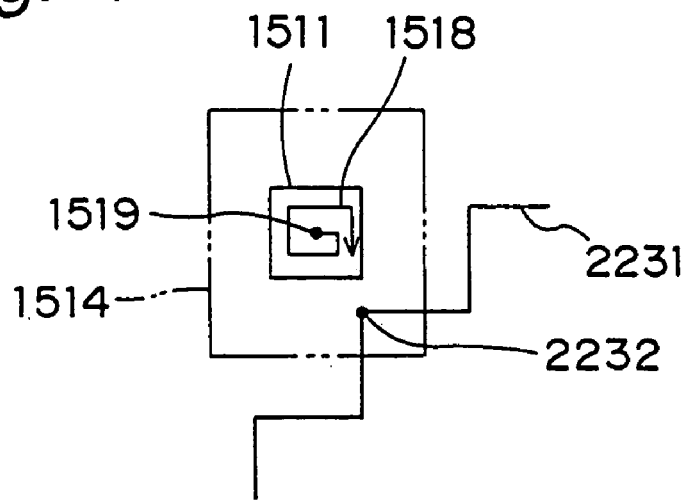
FIG. 23 is a diagram for explaining the search operation of FIG. 19.

During next step S324, as shown in FIG. 23, the first detection point 2232 is searched for while the image pickup camera 151 is moved by the distance 1517 in a search direction 1518, that is nearly spiral, inside the maximum deviation area 1514 from the search start position 1519. The distance 1517 is set to a distance corresponding to ⅓ the length in the X or Y direction of the view field 1511 during step S324 as well as during step S322.

The above manner of moving the image pickup camera 151 nearly spirally enables the first detection point 2232 to be detected early as compared with the method of moving the image pickup camera in the serpentine fashion, if the first detection point 2232 is highly possibly present in the vicinity of the center of the view field 1511. Moreover, when a region inside the view field 1511 where the first detection point 2232 is highly possibly present is already known, the first detection point 2232 can be detected early by moving the image pickup camera 151 spirally starting from a point within this region of high possibility.

A combined movement method of the above-described serpentine movement and spiral movement may also be adopted.

The search operation performed during steps S325-S328 will be discussed here, during which the first detection point 2232 is recognized during step S325 based on the search operation performed during steps S321-S322 and steps S323-S324.

Figure 24:
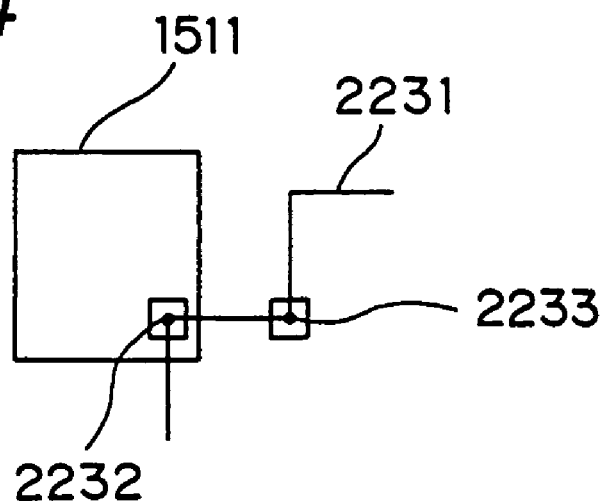
FIG. 24 is a diagram for explaining the search operation of FIG. 20.

During next step S326, it is determined whether or not a detection point for inclination correction, which corresponds to an example of a mark for detection, is present inside the view field 1511. The detection point for inclination correction is an arbitrary characteristic point on the semiconductor wafer 201 present inside the view field 1511 having the first detection point 2232 at a center thereof, and is preliminarily registered in the bump formation program. For example, as shown in FIG. 24, a corner part on an outline 2231 of the IC formation pattern, which is different from first detection point 2232, may be set as the detection point 2233 for inclination correction. The detection point 2233 for inclination detection may be an arbitrarily shaped part of the IC 223 present inside the view field 1511, or a mark for the detection point for inclination correction may be newly formed on the IC 223. Or a mark for the detection point for inclination correction may be formed in a region inside the view field 1511 and outside the outline 2231 where an aluminum film is formed.

When the detection point 2233 for inclination correction is determined to be inside the view field 1511 during above step S326, the inclination correction detection point 2233 is detected during step S327 without moving the image pickup camera 151. In contrast, if the inclination correction detection point 2233 is not present in the view field 1511 as in FIG. 24, the method proceeds to step S328.

Figure 25:
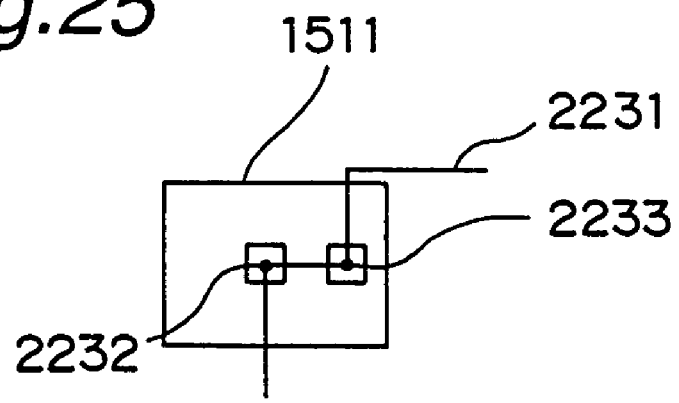
FIG. 25 is a diagram for explaining the search operation of FIG. 20.

During step S328, the image pickup camera 151 is moved to position the first detection point 2232 at the center of the view field 1511 as shown in FIG. 25 because a coordinates position of the first detection point 2232 for recognition is already known. Since the detection point 2233 for inclination correction is set to be present inside the view field 1511, in which the first detection point 2232 is present at the center of the view field 1511 as described hereinabove, the detection point 2233 for inclination correction can be caught within the view field 1511 by the above movement of the image pickup camera 151. Other than by moving the first detection point 2232 to the center of the view field 1511, the image pickup camera 151, namely, the view field 1511 may be sequentially moved to position the first detection point 2232 sequentially at four corner parts of the view field 1511 to catch the detection point 2233.

The method then proceeds to the aforementioned step S327, where the detection point 2233 for inclination correction is detected.

As described above, by preliminarily setting the detection point 2233 for inclination correction inside the view field 1511 and centering the first detection point 2232 for recognition, not only the first detection point 2232 for recognition can be recognized, but the detection point 2233 for inclination correction can also be recognized. As a result of this, positional deviation of the ICs 223 formed on the semiconductor wafer 201 can be detected, e.g., on the basis of coordinates information of the first detection point 2232, and moreover, rough information on the angle of inclination of the ICs 223 formed on the semiconductor wafer 201 can be obtained on the basis of the coordinates information of the first detection point 2232 for recognition and the detection point 2233 for inclination correction. A time necessary for a search to be performed during a recognition operation for a second detection point for recognition, to be described later, can be shortened or even eliminated.

Since the angle of inclination can be obtained with a higher accuracy if the inclination is obtained by detecting a position as far as possible from the first detection point 2232, recognizing a second detection point for recognition is performed in the embodiment as described below. However, the recognition operation for the second detection point for recognition can be eliminated and the inclination angle obtained with use of the detection point 2233 for inclination correction may be utilized.

Regarding detection point 2233 for inclination correction, a corner part in outline 2231 is set as the detection point 2233 for inclination correction in the present embodiment as above. The detection point 2233 in this embodiment is accordingly formed from two orthogonal lines. However, this detection mark is not limited to the above two orthogonal lines and an arbitrary shape, e.g., a circle, a triangle, a square, a cross or the like can be selected.

Figure 26:
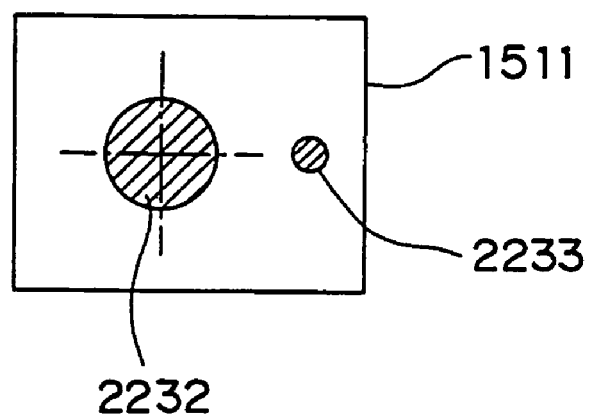
FIG. 26 is a diagram of an example of a shape of a detection mark for inclination correction during the search operation of FIG. 20.
Figure 27:
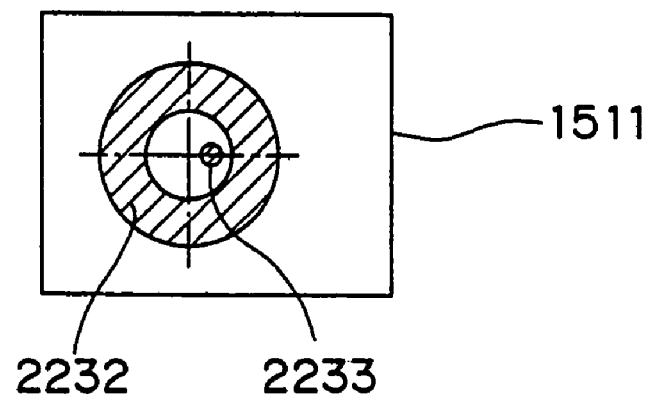
FIG. 27 is a diagram of an example of another shape of the detection mark for inclination correction during the search operation of FIG. 20.

When the shape is other than a circle, and if semiconductor wafer 201 is disposed exceeding, e.g., by ±5° a normal arrangement position whereby the recognition device 150 cannot determine an inclination difference of the semiconductor wafer 201, it is difficult to recognize the inclination difference. As such, when an inclination greater than ±5° is estimated, detection mark 2233 for inclination correction is preferably made circular, for example, in a form shown in FIG. 26 or 27.

Step S32 is completed by performing the above operation.

It is determined after step S33 whether or not the first detection point 2232 for recognition can be detected through a search operation performed during step S32. The method proceeds to next step S34 when the detection point can be detected, whereas an error stop is determined when the detection point cannot be detected and a bump formation process is stopped.

Figure 28:
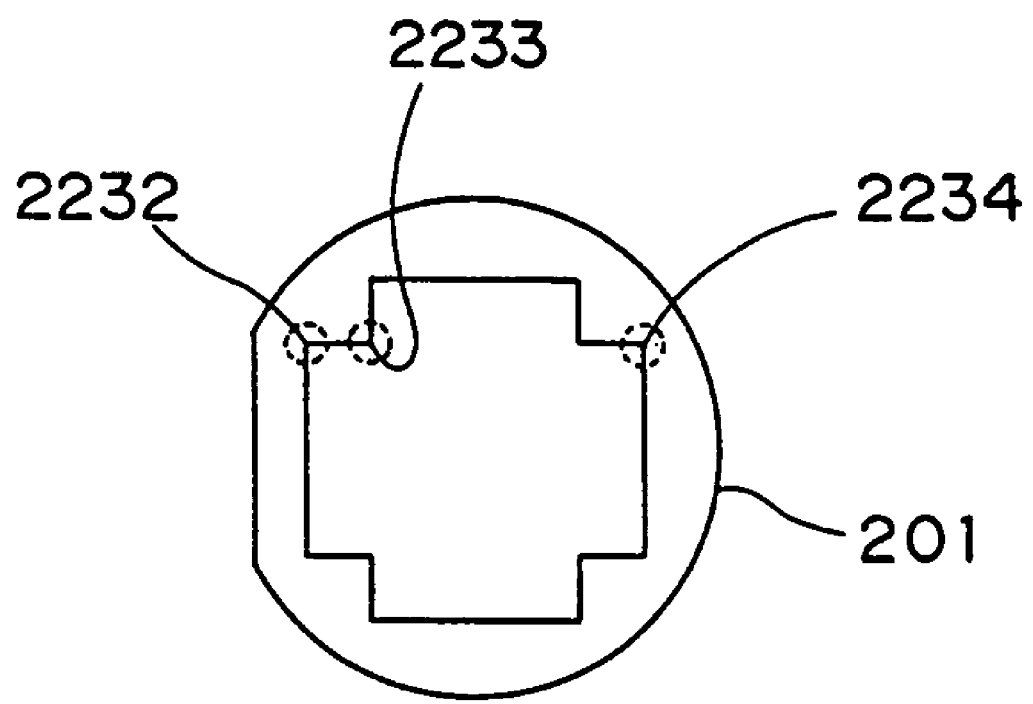
FIG. 28 is a diagram of one example of a second detection mark for recognition during step S4 of FIG. 1.

During step S34 similar to above step S31, it is determined whether or not the second detection point for recognition, which is a second point of characteristic points on the semiconductor wafer 201 placed on the wafer stage 1111 and corresponds to an example of a mark for detection, is recognized by the image pickup camera 151 of the recognition device 150. As shown in FIG. 28, second detection point 2234 for recognition may be set, e.g., to a corner part on outline 2231 similar to the first detection point 2232 for recognition.

When the semiconductor wafer 201 is inclined by within ±5° in terms of an inclination value of the semiconductor wafer 201, the first detection point 2232 for recognition and the detection point 2233 for inclination correction can be detected by moving the image pickup camera 151 in the X and Y directions. The image pickup camera 151 is then moved towards a position where the second detection point 2234 for recognition is present with utilization of rough information of the inclination angle obtained from positional information of the first detection point 2232 for recognition and the detection point 2233 for inclination correction. The second detection point 2234 for recognition is recognized by performing the same operation as that performed during step S32.

On the other hand, if inclination of the semiconductor wafer 201 is beyond ±5°, the image pickup camera 151 can be moved in a manner as follows towards a position where the second detection point 2234 for recognition is present. Since the heating device 110 has the wafer turning member 111 and the turning device 112, and hence can turn the semiconductor wafer 201 by any angle, as described earlier, in this embodiment the semiconductor wafer 201 is roughly positioned by the following operation. Namely, first, the image pickup camera 151 is moved while the wafer stage 1111 with the semiconductor wafer 201 thereon is turned, so that both end parts of an orientation flat of the semiconductor wafer 201 are detected. Then, the wafer stage 1111 is turned to a position which corresponds to ½ coordinates obtained on the basis of the above obtained positional information of the two end parts, whereby the semiconductor wafer 201 is roughly positioned. Thereafter, after recognizing the first detection point 2232 as above, the detection point 2233 for inclination correction is detected as in the description of steps S326-S328. The image pickup camera 151 is moved towards the position where the second detection point 2234 is present with utilization of the rough information on the inclination angle obtained from this positional information. An operation of roughly positioning the semiconductor wafer 201 by detecting the orientation flats may be omitted.

An operation similar to that performed during step S32 is performed during next step S35, whereby the second detection point 2234 for recognition is recognized.

By moving the image pickup camera 151 while turning the wafer stage 1111 in the manner as above, a quantity of movement of the image pickup camera 151 can be reduced and recognition of the detection point 2233 for inclination correction can be sped up.

It is determined during next step S36 whether or not the second detection point 2234 for recognition can be detected by the search operation performed during step S35. The method proceeds to next step S37 when the detection point can be detected. An error stop is determined when the detection point cannot be detected and the bump formation process is brought to a halt.

An angle for turning the wafer stage 1111 is obtained during step S37 on the basis of coordinates information of the first detection point 2232 for recognition and the second detection point 2234 for recognition obtained during above steps S32 and S35.

The control device 180 turns the wafer stage 1111 during following step S38 according to this obtained turning angle. Accordingly, the row and column directions as the arrangement direction of ICs 223 in the IC formation pattern of the semiconductor wafer 201 are agreed with the X and Y directions. The method proceeds to step S1 described before.

As explained above, before step S1 is executed, an inclination difference of the IC formation pattern is detected and a quantity of inclination is obtained, and then the semiconductor wafer 201 is turned beforehand in accordance with the quantity of inclination. The X direction is accordingly agreed with the row direction 221 and the Y direction is agreed with the column direction 222. Thus, since the inclination of the basic block 230 is already corrected at a time when bumps are to be formed, it is enough to recognize only one of two marks 224 for positional recognition of the basic block 230. Accordingly, the recognition operation can be lessened and productivity can be further improved.

As is detailed herein, according to the bump forming apparatus 101 and the bump formation method of the present embodiment, the number of times of performing a recognition operation is reduced in comparison with the conventional art, so that productivity can be improved. For instance when there are 3100 ICs formed on a semiconductor wafer and 8 bumps are to be formed on each IC, conventionally, approximately 80 minutes are required to form bumps if two marks are recognized for each IC. In contrast, bump formation can be completed in about 38 minutes by executing the operation performed during above steps S31-S38 and forming bumps in units of blocks as described above.

Productivity can hence be increased to approximately 1.5-3 times that of the conventional art according to the bump forming apparatus 101 and the bump formation method of the embodiment. In other words, if productivity is allowed to be at an equal level to that of the conventional art, an installation area of the bump forming apparatus can be reduced to approximately ⅟₁.₅-⅓ an installation area of the conventional art.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The invention claimed is:

1. An apparatus for forming bumps on a workpiece having a semiconductor wafer, comprising:

a bump bonding device for forming bumps on members arranged in a grid pattern on a workpiece, the members including ICs;

a recognition device, including an image pickup camera movable in column and row directions above the workpiece to image detection marks on the workpiece, for detecting a position and an inclination of the members based upon image pickup information of said image pickup camera;

a control device configured to:
   (i) define basic blocks from the members, each of the basic blocks having a plurality of the members adjacent one another in a row or column direction or in row and column directions,
   (ii) control said recognition device so as to independently recognize positions of the basic blocks, and
   (iii) control said bump bonding device, based upon positional recognition information obtained from independently recognizing the position of a respective one of the basic blocks, so as to continuously form bumps on the members defining the respective one of the basic blocks;

a wafer turning member onto which the semiconductor wafer is to be loaded, said wafer turning member being rotatable in a circumferential direction of the semiconductor wafer when loaded on said wafer turning member; and a turning device for turning said wafer turning member in the circumferential direction via control of said control device;

wherein the control device is also configured to:
  (i) control said recognition device so as to detect an inclination of the ICs on the semiconductor wafer, prior to controlling said recognition device so as to independently recognize positions of the basic blocks,
  (ii) control said turning device on the basis of the detected inclination so as to turn said wafer turning member and thereby turn the semiconductor wafer loaded thereon such that the inclination is corrected, and
  (iii) at a time of controlling said recognition device so as to independently recognize positions of the basic blocks, control said recognition device so as to detect an inclination of the ICs defining a respective one of the basic blocks by recognizing only one of the two marks; and
  (iv) control said recognition device so as to independently recognize positions of the basic blocks by controlling said recognition device so as to independently recognize two marks from among plural marks applied to each IC defining the basic blocks.

2. The apparatus according to claim 1, wherein
said bump bonding device is configured to form bumps on the members by forming bumps on electrodes of the ICs, and
said control device is also configured to determine a number of the ICs that is to define each of the basic blocks based upon an allowance value for positional deviation between the electrodes of the ICs defining each of the basic blocks and the bumps to be formed on the electrodes of the ICs defining each of the basic blocks.

3. The apparatus according to claim 2, wherein
said control device is also configured to determine the number of the ICs defining each of the basic blocks based upon at least one of
  (i) a position on the semiconductor wafer where the bumps are to be formed on the electrodes, and
  (ii) an amount of time elapsed after commencement of forming bumps on the electrodes.

4. The apparatus according to claim 1, wherein
said control device is also configured to cause, after defining the basic blocks from the ICs and when ICs remain on the semiconductor wafer in an amount not satisfying an amount of the ICs defining each of the basic blocks, said recognition device to perform positional recognition and causing said bump bonding device to perform bump formation for each of the remaining ICs individually, or for a combination of a plurality of the remaining ICs and one remaining IC, until bumps are formed on all of the remaining ICs.

5. The apparatus according to claim 1, wherein
said control device is also configured to control said recognition device so as to detect defective IC information which identifies a defective IC from among the ICs on the semiconductor wafer.

6. The apparatus according to claim 5, wherein
said control device is also configured to cause said bump bonding apparatus to not form bumps on any defective IC as identified by detected defective IC information.

* * * * *